US012812982B2

(12) United States Patent
Agarwal et al.

(10) Patent No.: US 12,812,982 B2
(45) Date of Patent: Nov. 24, 2026

(54) DEVICE, METHOD AND SYSTEM FOR SELECTIVELY DISABLING A POWER CLAMP CIRCUIT

(71) Applicant: Intel Corporation, Santa Clara, CA (US)

(72) Inventors: Ritesh Agarwal, Munich (DE); Harshit Dhakad, Bangalore (IN); Krzysztof Domanski, Neubiberg (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/209,358

(22) Filed: Jun. 13, 2023

(65) Prior Publication Data

US 2024/0421150 A1 Dec. 19, 2024

(51) Int. Cl.
*H10D 89/60* (2025.01)

(52) U.S. Cl.
CPC ................................. *H10D 89/819* (2025.01)

(58) Field of Classification Search
CPC ....................... H10D 89/819; H03K 19/00315
USPC ............................................................ 361/56
See application file for complete search history.

(56) References Cited

U.S. PATENT DOCUMENTS 5,430,595 A 7/1995 Wagner et al.
6,310,379 B1 * 10/2001 Andresen ............. H10D 89/815 257/362
7,230,806 B2 6/2007 Poon et al.
8,514,533 B2 8/2013 Mozak et al.
8,785,968 B2 7/2014 Shrivastava et al.
9,368,485 B1 6/2016 Chu
10,630,075 B2 4/2020 Henzler et al.
11,652,348 B2 5/2023 Zhou et al.
2005/0275989 A1 * 12/2005 Chen .................... H10D 89/811 361/93.1
2011/0149450 A1 6/2011 Maloney et al.
2013/0050885 A1 * 2/2013 Chen ......................... H02H 9/04 361/56
2013/0182356 A1 * 7/2013 Yang ...................... H02H 9/046 361/56

(Continued)

FOREIGN PATENT DOCUMENTS

CN 105655331 A 6/2016
WO 2015094198 6/2015
WO 2017078676 5/2017

*Primary Examiner* — Kevin J Comber
(74) *Attorney, Agent, or Firm* — Essential Patents Group, LLP

(57) ABSTRACT

Techniques and mechanisms for selectively disabling functionality of a power clamp circuit which is to mitigate damage due to electrostatic discharge (ESD). In an embodiment, a shut-off circuit is coupled to receive a control signal which indicates an actual or expected future power state transition of a load. The power clamp circuit comprises a pull-up circuit and a pull-down circuit which are coupled in series between a first interconnect and a second interconnect, which are to receive a first supply voltage and a second supply voltage, respectively. Based on a filtered version of the control signal, the shut-off circuit generates a first one or more signals to selectively disable the pull-up circuit. The shut-off circuit further generates a second one or more signals, based on the filtered version of the control signal, to selectively disable the pull-down circuit.

20 Claims, 12 Drawing Sheets

(56) References Cited

U.S. PATENT DOCUMENTS

| | | | | |
|---|---|---|---|---|
| 2015/0270258 | A1* | 9/2015 | Dabral | H02H 3/20 361/56 |
| 2015/0288173 | A1* | 10/2015 | Chen | H02H 9/046 361/56 |
| 2016/0240525 | A1 | 8/2016 | Shrivastava et al. | |
| 2017/0346277 | A1* | 11/2017 | Su | H02H 9/046 |
| 2019/0164953 | A1* | 5/2019 | Taghizadeh Kaschani | G01R 31/002 |
| 2020/0083705 | A1* | 3/2020 | Xavier | H02H 9/046 |

* cited by examiner

800

DEVICE, METHOD AND SYSTEM FOR SELECTIVELY DISABLING A POWER CLAMP CIRCUIT

BACKGROUND

1. Technical Field

This disclosure generally relates to electrostatic discharge protection and more particularly, but not exclusively, to improved performance of input/output (IO) protection or power clamp circuitry.

2. Background Art

Electrostatic discharge (ESD) refers to the phenomenon of electrical discharge of high current for a short time duration resulting from a buildup of static charge on a particular integrated circuit package, or on a nearby human handling that particular IC package. ESD events can have serious detrimental effects on manufacture and performance of integrated circuits (ICs) and other microelectronic devices, systems that contain such devices and manufacturing facilities that produce them. Advances in silicon process technology have led to the development of increasingly smaller sizes for transistors in integrated circuits. In turn, the decreasing size of transistors has made the circuits increasingly susceptible to damage from ESD events.

The electronic industry continues to scale microelectronic structure to achieve faster devices, new devices, and more per unit area. ESD continues to be a threat for scaled structures produced using various new technologies used in the electronic industry, such as, submicron device technologies, high system operation speeds, higher levels of factory automation, etc. As integrated circuit devices increase in density and their operating supply voltages decrease, the integrated circuits become more sensitive to the effects of ESD. Especially, ESD is a serious problem for semiconductor devices since it has the potential to cause malfunction of an entire IC due to device or interconnect damage. Because ESD events occur often across the silicon circuits attached to IC package terminals, circuit designers have concentrated their efforts on developing adequate protection mechanisms for these sensitive circuits.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
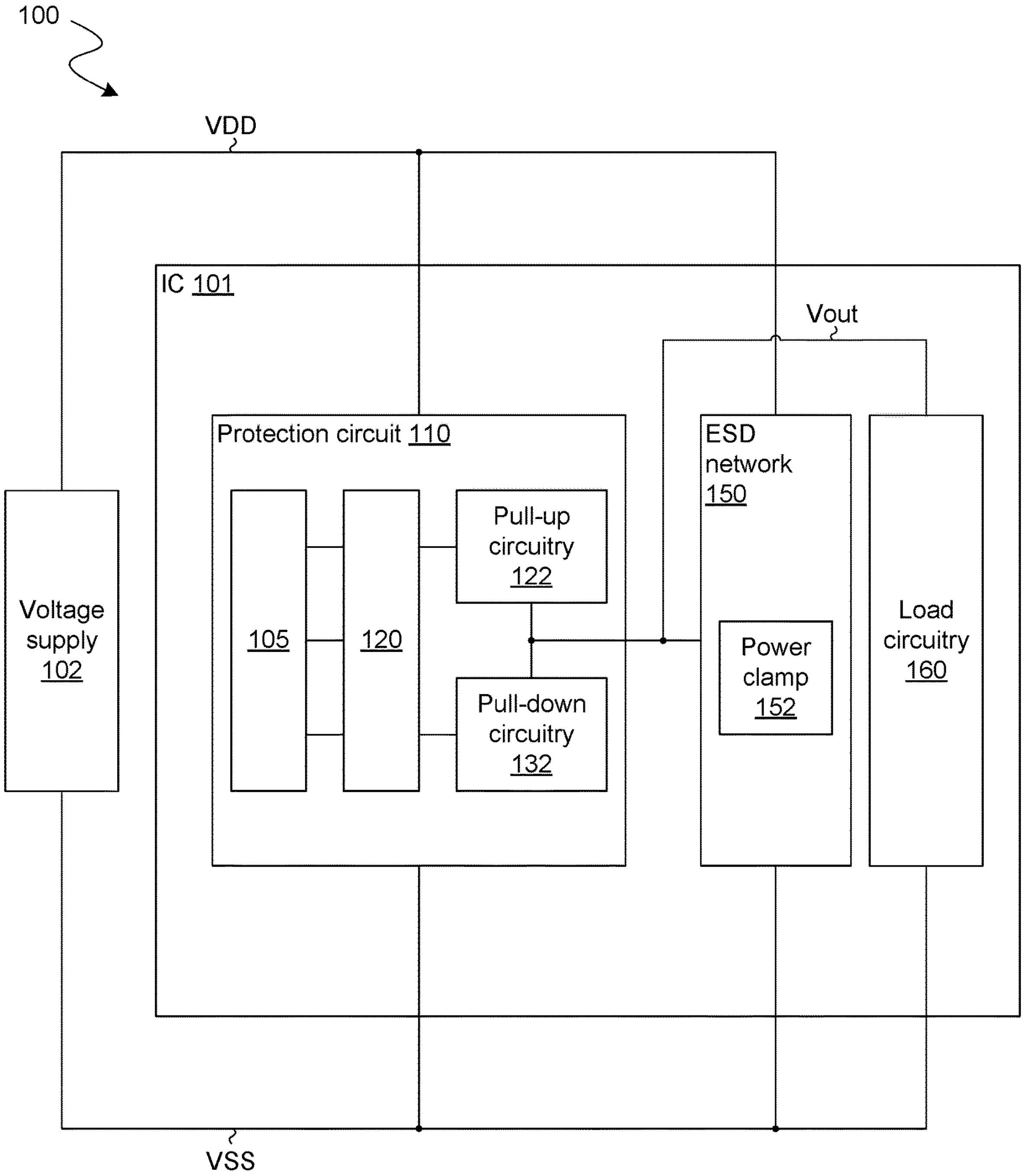
FIG. 1 shows a block diagram illustrating features of a system to provide electrostatic discharge protection functionality according to an embodiment.

Embodiments discussed herein variously provide techniques and mechanisms for efficiently mitigating the risk of damage to circuitry due to electrostatic discharge. Various direct current (DC) to DC (or "DC-DC") voltage converters typically use a type of transistor—referred to as a "high voltage" transistor—which, as compared to other types, have relatively high breakdown voltages. High-voltage transistors typically handle about 1.8 Volts (V) to 5V or more (where more recent finFET technologies can handle 1.32 V to 2 V, for example), while low-voltage transistors are designed to operate at a smaller supply voltage—e.g., less than 1 V. and typically in a range of 0.7 V to 1 V. Accordingly, high-voltage transistors have gate lengths that can be an order of magnitude larger than low-voltage transistors. In the state-of-the-art devices, the low-voltage transistors are fabricated to have gate lengths in the submicron range.

Some embodiments variously provide and/or otherwise use an efficient circuit architecture which facilitates ESD protection with a DC-DC output stage. Circuitry of such an architecture (referred to herein as "protection circuitry") is operable to provide a deterministic state of pull-up circuitry and/or pull-down circuitry. For example, protection circuitry according to some embodiments provides "keep-on/keep-off" functionality whereby pull-up circuitry is deterministically kept in an inactive (e.g., non-conducting, or "off") state during an ESD event, while pull-down circuitry is deterministically kept in an active (e.g., conducting, or "on") state during the ESD event. Some embodiments additionally or alternatively provide "keep-on/keep-on" functionality whereby both pull-up and pull-down circuitry are deterministically kept each in a respective active state. In providing such deterministic states, some embodiments variously improve upon existing ESD protection circuit designs—e.g., by significantly mitigating the chance of an excessively large voltage drop across a single circuit element (a single transistor, for example). These improvements facilitate the use of low-voltage transistors in a DC-DC voltage converter, which enables improved area efficiency and/or costs.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including a DC-DC voltage converter circuit.

FIG. 1 shows a system 100 which provides electrostatic discharge protection functionality according to an embodiment. System 100 illustrates features of one example embodiment which automatically transitions to, and subsequently from, an operational mode which prevents or otherwise mitigates circuit damage which would otherwise be possible due to an electrostatic discharge (ESD).

As shown in FIG. 1, system 100 comprises one or more integrated circuit (IC) chips—e.g., comprising the illustrative IC 101 shown—and (for example) a voltage supply which provides power to some or all circuitry of the one or more IC chips. For example, system 100 comprises—or alternatively, is to couple to—a voltage supply 102 with which power is delivered to a load of IC 101 (such as the illustrative load circuitry 160 shown).

In one such embodiment, system 100 comprises a first interconnect (e.g., a first power supply rail) which is coupled to provide a supply voltage VDD from voltage supply 102. Furthermore, system 100 comprises a second interconnect (e.g., a ground rail) for providing another supply voltage VSS. For example, the supply voltage VSS is a ground voltage or other suitable reference potential. The supply voltage VSS is a potential which is at a level lower than that of the supply voltage VDD. In one example embodiment, during a steady state of operations by system 100, the supply voltage VDD is substantially equal to 3.3 V—e.g., wherein, during the steady state, the supply voltage VSS is substantially equal to 0 V. However, some embodiments are not limited to a particular level of supply voltage VDD or of supply voltage VSS.

In the example embodiment shown, the load circuitry 160 of IC 101 is coupled between the first and second interconnects—e.g., wherein load circuitry 160 is designed to perform any of various predetermined functions. In an illustrative scenario according to one embodiment, load circuitry 160 comprises one or more processors, controllers, memory devices, application specific integrated circuits (ASICs), input/output (IO) interfaces, and/or the like. However, some embodiments are not limited with respect to any particular function or functions that might be provided with load circuitry 160.

To facilitate safe delivery of power to load circuitry 160, IC 101 further comprises interconnected circuit elements—referred to herein as an electrostatic discharge (ESD) network—which are to provide, at least in part, a circuit path for conducting an ESD current. In the illustrative embodiment shown, IC 101 comprises an ESD network 150 which (for example) comprises a power clamp 152. The power clamp 152 comprises a current sinking circuit in the form of a switchable discharge device coupled between the respective interconnects for providing supply voltage VDD and supply voltage VSS. In some embodiments, power clamp 152 includes circuitry which (for example) is adapted from any of various conventional clamp circuit designs. The details of such conventional clamp circuit designs are not set forth hereinto avoid obscuring certain features of said embodiments.

ESD network 150 operates in combination with a protection circuit 110 of IC 101. Protection circuit 110 is operable to selectively make available another circuit path for conducting ESD current. ESD network 150 and protection circuit 110 provide functionality to protect load circuitry 160, at least in part, against electrostatic discharge by non-destructively passing, for a short time period, large currents through a low impedance path—e.g., when one or more circuit elements along said path are in a conductive (or "on" state). Various other embodiments omit some or all of voltage supply 102. ESD network 150, and/or load circuitry 160.

In the example embodiment shown, protection circuit 110 comprises pull-up circuitry 122 and pull-down circuitry 132 which, for example, are coupled in series with each other between the first interconnect and the second interconnect. For example, pull-up circuitry 122 and pull-down circuitry 132 are coupled to each other via a node (referred to herein as an "output node") by which IC 101 provides to load circuitry 160 a voltage Vout which is based on supply voltages VDD. VSS. In an embodiment, pull-up circuitry 122 and pull-down circuitry 132 are further coupled to ESD network 150 via the output node.

In one such embodiment, pull-up circuitry 122 comprises first switch circuits—e.g., a first plurality of transistors—which are coupled in series with each other between the first interconnect and the output node. Additionally or alternatively, pull-down circuitry 132 comprises second switch circuits—e.g., a second plurality of transistors—which are coupled in series with each other between the output node and the second interconnect.

In various embodiments, protection circuit 110 is variously (re)configurable to operate, at different times, in any of various operational modes (or simply "modes" herein, for brevity)—e.g., based on whether load circuitry 160 (and/or other circuitry of IC 101) is experiencing an ESD event. In one such embodiment, the modes of protection circuit 110 comprise a first mode which (for example) a control circuitry 120 of protection circuit 110 is to configure based on the detection of an ESD event—e.g., wherein the first mode is to provide a conductive path for an ESD current.

During the first mode, pull-up circuitry 122 is in a disabled state which (for example) prevents a conduction of current between the first interconnect and the output node via the pull-up circuitry 122. By way of illustration and not limitation, the first mode comprises in-series switch circuits of pull-up circuitry 122 each being in a respective inactive (e.g., non-conducting, or "off") state. Furthermore, during the first mode, pull-down circuitry 132 is in an enabled state which (for example) enables a conduction of current between the output node and the second interconnect via the pull-down circuitry 132. In one such embodiment, the first mode further comprises in-series switch circuits of pull-down circuitry 132 each being in a respective active (e.g., conducting, or "on") state.

In some embodiments, the modes of protection circuit 110 further comprise a second mode which (for example) protection circuit 110 automatically transitions to—e.g., based on operation of IC 101 according to the first mode. In one such embodiment, transitioning to the second mode comprises disabling or otherwise preventing a conductive path which is provided by the first mode. During the second mode, pull-up circuitry 122 is in an enabled state which (for example) enables a conduction of current between the first interconnect and the output node via the pull-up circuitry 122. By way of illustration and not limitation, the second mode comprises in-series switch circuits of pull-up circuitry 122 each being in a respective active state. Furthermore, during the second mode, pull-down circuitry 132 is in a disabled state which (for example) prevents a conduction of current between the output node and the second interconnect via the pull-down circuitry 132. In one such embodiment, the second mode further comprises in-series switch circuits of pull-down circuitry 132 each being in a respective inactive state.

In one embodiment, control circuitry 120 is coupled to detect one or more indicia of an ESD event, and to variously provide—e.g., to pull-up circuitry 122 and/or pull-down circuitry 132—control signaling, based on such detecting, which transitions protection circuit 110 to the first mode. By way of illustration and not limitation, control circuitry 120 is coupled to directly or indirectly detect a change to the supply voltage VDD—e.g., wherein control circuitry 120 detects that such a voltage change is sufficiently large and/or sufficiently fast. In one such embodiment, control circuitry 120 is operable to detect a relatively high frequency component of the voltage change. Whether the component in question is sufficiently high frequency is determined, for example, based on some or all of one or more threshold voltages, biases, impedances (for example, one or more capacitances, and/or or more resistances) and/or other characteristics of the protection circuit 110.

In various embodiments, the first mode provides a path by which ESD current is conducted—e.g., wherein such conduction contributes to a subsequent, and automatic, transition of IC 101 from the first mode (to the second mode or another mode, for example). For example, the first mode enables conduction with a resistor-capacitor (RC) circuit of protection circuit 110. In this particular context, "RC circuit" refers herein to a set of circuit elements which are coupled to each other, wherein the set of circuit elements comprises at least one capacitor and at least one resistor. In an embodiment, the RC circuit has any of various suitable architectures—e.g., comprising a bridge circuit architecture—which facilitates, for each of one or more switch circuits of protection circuit 110, a respective one of a turn-off time or a turn-on time. In providing these one or more turn-on times and/or one or more turn-off times, some embodiments automatically limit a duration of protection circuit 110 being in the first mode. In some embodiments, protection circuit 110 automatically transitions from the first mode to another mode (such as the second mode). For example, in transitioning to the second mode, protection circuit 110 (re)enables control circuitry 120 to detect a next ESD event—e.g., to (re)enable an automatic triggering of a next instance of the first mode based on the next ESD event.

In the example embodiment shown, control circuitry 120 is coupled to a voltage divider circuit 105 which is also coupled between the first interconnect and the second interconnect. For example, voltage divider circuit 105 comprises an in-series arrangement of impedance elements (e.g., comprising capacitors or resistors), wherein control circuitry 120 is coupled to sample or otherwise detect various voltages each between a respective two of said impedance elements. In an embodiment, configuration of the first mode comprises activating one or more elements of an RC circuit which is to limit a duration of the first mode. For example, such an RC circuit comprises one or more circuit elements of voltage divider circuit 105, control circuitry 120, pull-up circuitry 122, and/or pull-down circuitry 132.

Figure 2:
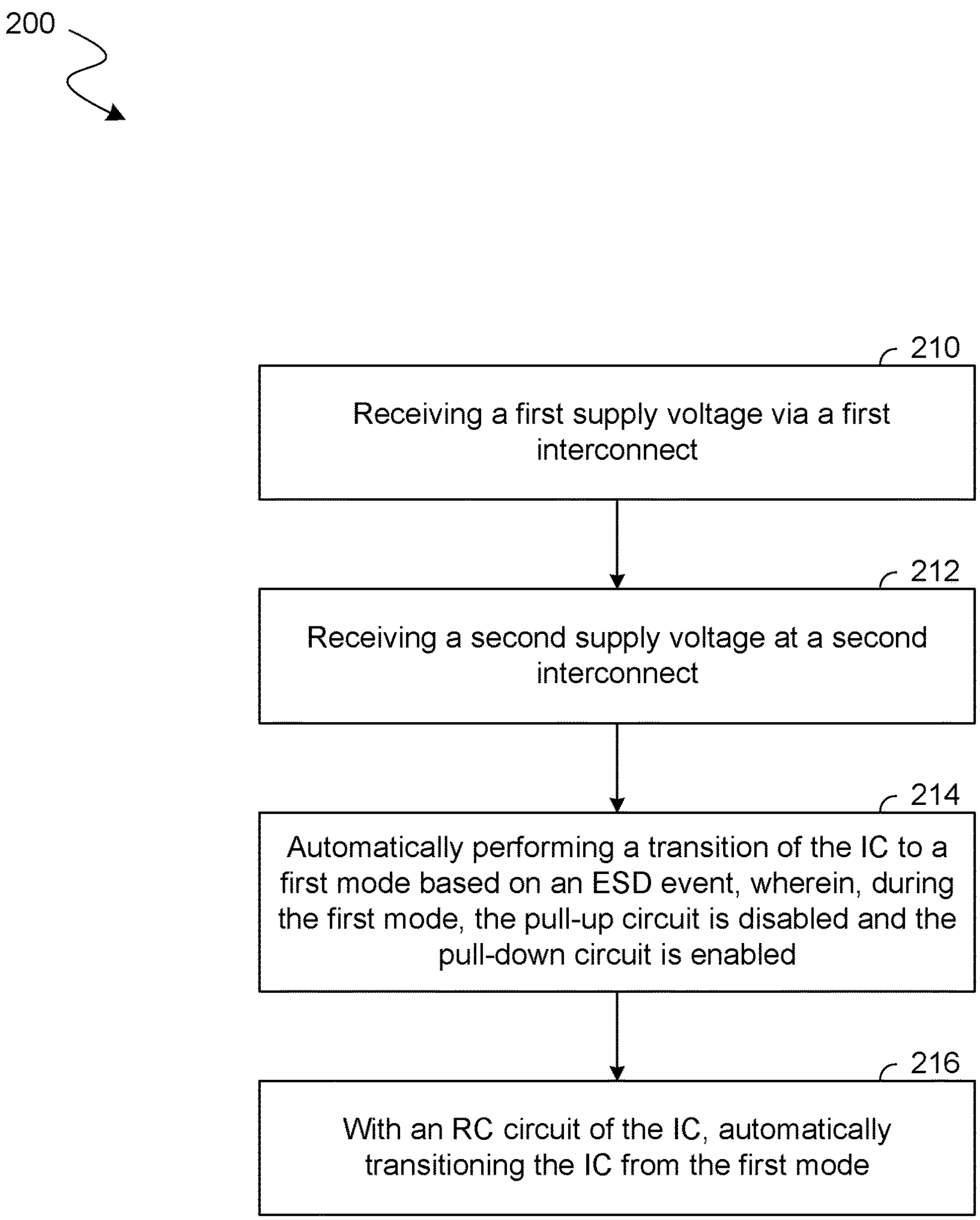
FIG. 2 shows a flow diagram illustrating features of a method to operate electrostatic discharge circuitry according to an embodiment.

FIG. 2 shows a method 200 for operating electrostatic discharge circuitry according to an embodiment. Method 200 illustrates one example of an embodiment which is performed at an integrated circuit (IC) comprising a voltage converter that provides electrostatic discharge (ESD) protection functionality by automatically transitioning to (and subsequently from) a mode which facilitates conduction of an ESD current. Operations such as those of method 200 are performed with any of various combinations of suitable hardware (e.g., circuitry) which, for example, provides some or all of the functionality of protection circuit 110.

As shown in FIG. 2, method 200 comprises (at 210) receiving a first supply voltage at a first interconnect—e.g., including receiving the supply voltage VDD shown in FIG. 1. Method 200 further comprises (at 212) receiving at a second interconnect a second supply voltage such as a ground voltage or other reference potential.

In various embodiments, the IC comprises a voltage divider (such as voltage divider 105) which includes capacitors coupled in series with each other between the first interconnect and the second interconnect. In one such embodiment, the IC further comprises a pull-up circuit and a pull-down circuit—e.g., pull-up circuitry 122 and pull-down circuitry 132 (respectively)—which are coupled in series with each other between the first interconnect and the second interconnect. For example, the IC is to provide an output voltage Vout at a first node which is between the first interconnect and the second interconnect, wherein the output voltage Vout is based on the supply voltages VDD. VSS. The IC further comprises control circuitry (such as control circuitry 120) which is coupled—e.g., in a bridge configuration with the voltage divider—between the first interconnect and the second interconnect.

In various embodiments, the pull-up circuitry comprises p-channel metal-oxide semiconductor (PMOS) transistors which are coupled in series with each other between the first interconnect and the first node which provides output voltage Vout. The pull-down circuitry comprises n-channel metal-oxide semiconductor (NMOS) transistors which are coupled in series with each other between the first node and the second interconnect. In one such embodiment, the IC further comprises ballast resistors which each correspond to a different respective transistor of the PMOS transistors and the NMOS transistors. For example, each of the ballast resistors is coupled between a respective two terminals of the corresponding transistor.

Method 200 further comprises (at 214) automatically performing a transition of the IC to a first mode based on an electrostatic discharge (ESD) event. During the first mode, the pull-up circuit is disabled and the pull-down circuit is enabled. More particularly, the first mode prevents conductivity between the first interconnect and the first node via the pull-up circuitry, wherein the first mode provides conductivity between the first node and the first interconnect via the pull-down circuitry.

In some embodiments, the control circuitry comprises pull-up control circuitry, which controls operation of the pull-up circuitry, and further comprises pull-down control circuitry which controls operation of the pull-down circuitry. In one such embodiment, one of the pull-up control circuitry or the pull-down control circuitry comprises driver circuitry which receives a first input signal based on a first voltage at a first node (e.g., between a first pair of capacitors) of the voltage divider. For example, the driver circuitry comprises an inverter circuit, and a capacitor which is coupled to the inverter circuit (e.g., at an input thereof).

Referring again to FIG. 2, method 200 further comprises (at 216) automatically transitioning the IC from the first mode with a resistor-capacitor (RC) circuit of the IC. For example, in some embodiments, one of the pull-up circuitry or the pull-down circuitry comprises a first transistor, wherein a gate terminal of the first transistor receives a first gate signal which is generated with the capacitor and the inverter circuit based on the first input signal.

In one such embodiment, the first mode comprises an activation state of the first transistor (e.g., a particular one of an active state or an inactive state), wherein a duration of the activation state of the first transistor is based on the capacitor. For example, the RC circuit, which includes the capacitor, limits a duration of the first transistor being in the activation state.

In some embodiments, the one of the pull-up circuitry or the pull-down circuitry further comprises a second transistor, wherein a gate terminal of the second transistor receives a second gate signal which is based on the first input signal. In one such embodiment, the second gate signal is generated, based on the first input signal, with a resistor which is coupled between the capacitor and the gate terminal of the second transistor.

In various embodiments, the one of the pull-up control circuitry or the pull-down control circuitry further comprises a first turn-on circuit which receives a second input signal which is based on a second voltage at a second node (e.g., between a second pair of capacitors) of the voltage divider. In one such embodiment, the first turn-on circuit provides a third gate signal, based on the second input signal, to a gate terminal of a third transistor of the one of the pull-up circuitry or the pull-down circuitry. The first mode further comprises an activation state of the third transistor, wherein a duration of the activation state of the third transistor is based on two capacitors of the voltage divider.

In one example embodiment, the pull-down circuitry comprises the first transistor, wherein the first gate signal is further generated with a first resistor based on the first input signal. The first resistor is coupled between the inverter circuit and the gate terminal of the first transistor—e.g., wherein the duration of the activation state of the first transistor is further based on the resistor.

Figure 3:
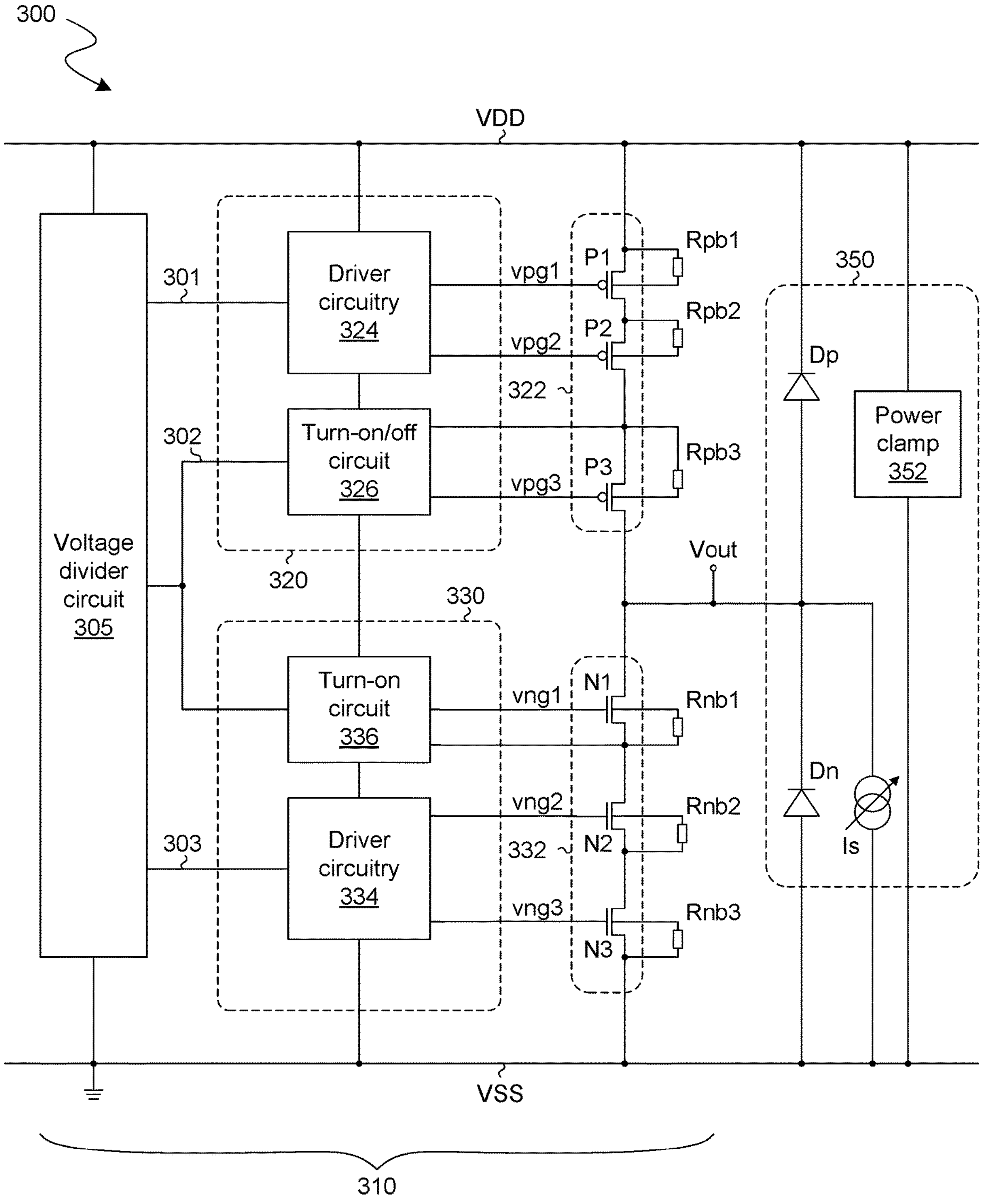
FIG. 3 shows a block diagram illustrating features of a device to facilitate electrostatic discharge protection according to an embodiment.

FIG. 3 shows a device 300 which facilitates electrostatic discharge protection according to an embodiment. Device 300 illustrates features of one example embodiment which automatically provides a "keep-on/keep-off" mode wherein pull-up circuitry is deterministically kept in an inactive state during an ESD event, while pull-down circuitry is deterministically kept in an active state during the ESD event. In some embodiments, device 300 provides functionality such as that of system 100—e.g., wherein one or more operations of method 200 are performed with circuitry of device 300.

As shown in FIG. 3, device 300 comprises a protection circuit 310 and an ESD network 350 which is coupled to protection circuit 310 via an "output node" by which a voltage Vout is provided to a load circuit (not shown). In the example embodiment shown, circuitry of protection circuit 310 is coupled between a first interconnect and a second interconnect which are to receive, respectively, a first supply voltage VDD and a second supply voltage VSS—e.g., where the voltages VDD. VSS are generated by a voltage supply (not shown) which is part of, or is to be coupled to, device 300. In one such embodiment, protection circuit 310 provides DC-DC converter functionality to generate voltage Vout based on supply voltages VDD, VSS.

In an embodiment, protection circuit 310 and ESD network 350 correspond functionally to protection circuit 110 and ESD network 150 (respectively). For example, device 300 comprises pull-up transistors 322 and pull-down transistors 332 which, in some embodiments, correspond functionally to pull-up circuitry 122 and pull-down circuitry 132 (respectively). Pull-up transistors 322 and pull-down transistors 332 are controlled with pull-up control circuitry 320 and pull-down control circuitry 330 (respectively) of device 300—e.g., wherein functionality of control circuitry 120 is provided with pull-up control circuitry 320 and pull-down control circuitry 330. In one such embodiment, protection circuit 310 further comprises a voltage divider circuit 305 which is coupled to pull-up control circuitry 320 and pull-down control circuitry 330—e.g., wherein voltage divider circuit 305 provides functionality such as that of voltage divider circuit 105.

In the example embodiment shown, ESD network 350 comprises a p-type diode Dp which is coupled between the first interconnect and the output node. Furthermore, ESD network 350 comprises an n-type diode Dn which is coupled between the output node and the second interconnect. It should be appreciated that the level of supply voltage VDD at the first interconnect controls at least in part when electrical current is transmitted through diode Dp from the output node. For example, when voltage Vout at the output node is higher than the level of supply voltage VDD, diode Dp is forward biased. Hence, electrical current at the output node may be transmitted through diode Dp to first interconnect. In one illustrative embodiment, diodes Dp, Dn are shallow trench isolation (STI) diodes—e.g., wherein diode Dp includes a P+ diffusion region formed in an N-well (P+/N-well) whereas diode Dn includes an N+ diffusion region formed in a P-well (N+/P-well).

Under normal operation (e.g., not during an ESD event), diodes Dp, Dn are in reverse biased states because the supply voltage VDD at the first interconnect is at a level higher than (or equal to) the output voltage Vout, the supply voltage VSS at the second interconnect is at a level lower than the output voltage Vout. However, when an ESD event occurs, a large amount of electrical current may be transmitted through the output node which provides voltage Vout. As a result, the level of voltage Vout is at risk of being, at least temporarily, greater than that of supply voltage VDD. This causes diode Dp to become forward biased, which results in ESD current being conducted through the first interconnect to power clamp 352.

In an illustrative scenario according to one embodiment, an electrostatic discharge event forces an ESD current (represented symbolically as the current source Is shown) to the output node by which the voltage Vout is provided to load circuitry. To accommodate such an ESD current, ESD network 350 enables one or more conductive paths between the output node and the second interconnect. By way of illustration and not limitation, one such path conducts ESD current from the output node to the first interconnect via diode Dp, and then from the first interconnect to the second interconnect via power clamp 352. Protection circuit 310 further facilitates an additional (or alternative) path to conduct ESD current—e.g., a path from the output node to the second interconnect via pull-down transistors 332.

For example, voltage divider circuit 305 comprises an in-series arrangement of capacitors (and/or other suitable impedance elements) which are coupled between the first interconnect and the second interconnect. Driver circuitry 324 of pull-up control circuitry 320 is coupled to receive a first signal 301 which is based on a first voltage at a first node between a respective two capacitors of voltage divider circuit 305. Furthermore, both a turn-on/off circuit 326 of pull-up control circuitry 320 and a turn-on circuit 336 of pull-down control circuitry 330 are coupled to receive a second signal 302 which is based on a second voltage at a second node between a respective two capacitors of voltage divider circuit 305. Further still, a driver circuitry 334 of pull-down control circuitry 330 is coupled to receive a third signal 303 which is based on a third voltage at a third node between a respective two capacitors of voltage divider circuit 305. In one such embodiment, the first voltage is greater than the second voltage, which is greater than the third voltage.

In an embodiment, pull-up transistors 322 (such as the illustrative three PMOS transistors p1, p2, p3 shown) are coupled, in series with each other, between the first interconnect and the output node. In the example embodiment, transistors p1, p2 are coupled in series with each other between the first interconnect and transistor p3—e.g., wherein transistor p3 is coupled between the output node and the transistors p1, p2. Based on signal 301, driver circuitry 324 provides a gate voltage vpg1 to selectively enable or disable transistor P1, and another gate voltage vpg2 to selectively enable or disable transistor P2. Based on signal 302, turn-on/off circuit 326 provides a gate voltage vpg3 to selectively enable or disable transistor P3. In an embodiment, the difference between voltage Vout and supply voltage VDD is relatively small, as there is only a small voltage drop across diode Dp while transistors N1, N2 and N3 conduct a relatively high current. This small voltage difference—e.g., in combination with the respective biases of gate voltages vpg1, vpg2, vpg3—contributes to transistors P1, P2 and P3 remaining off.

Furthermore, pull-down transistors 332 (such as the illustrative three NMOS transistors N1, N2, N3 shown) are coupled, in series with each other, between the output node and the second interconnect. In the example embodiment, transistors N2, N3 are coupled in series with each other between the second interconnect and transistor N1—e.g., wherein transistor N1 is coupled between the output node and the transistors N2, N3. Based on signal 303, driver circuitry 334 provides a gate voltage vng2 to selectively enable or disable transistor N2, and another gate voltage vng3 to selectively enable or disable transistor N3. Based on signal 302, turn-on circuit 336 provides a gate voltage vng1 to selectively enable or disable transistor N1.

In the example embodiment shown, gate voltages vpg1, vpg2, vpg3 are provided with resistors Rpg1, Rpg2, Rpg3 (respectively), wherein gate voltages vng1, vng2, vng3 are provided with resistors Rng1, Rng2, Rng3 (respectively). In one such embodiment, resistors Rpg1, Rpg2, Rpg3 and resistors Rng1, Rng2, Rng3 each has a resistance of less than 10 microOhms (mΩ), for example. In an alternative embodiment, device 400 omits resistors Rpg1, Rpg2, Rpg3 and resistors Rng1, Rng2, Rng3.

In some embodiments, one or more circuit elements of pull-up control circuitry 320 are coupled, in series with one or more other circuit elements of pull-down control circuitry 330, between the first interconnect and the second interconnect. For example, one or more circuit elements of driver circuitry 324 are coupled in series with one or more circuit elements of turn-on/off circuit 326—e.g., wherein turn-on/off circuit 326 is coupled to the first interconnect via driver circuitry 324. Furthermore, one or more circuit elements of circuitry of driver circuitry 334 are coupled in series with one or more circuit elements of turn-on circuit 336—e.g., wherein turn-on circuit 336 is coupled to the second interconnect via driver circuitry 334.

Accordingly, in some embodiments, an activity state (e.g., one of an active state or an inactive state) of one of pull-up control circuitry 320 or pull-down control circuitry 330 determines, at least in part, whether the other of pull-up control circuitry 320 or pull-down control circuitry 330 is to be able to draw current from the first interconnect. Additionally or alternatively, an activity state of one of driver circuitry 324 or turn-on/off circuit 326 determines, at least in part, whether the other of driver circuitry 324 or turn-on/off circuit 326 is to be able to draw current from the first interconnect. Similarly, an activity state of one of driver circuitry 334 or turn-on circuitry 336 determines, at least in part, whether the other of driver circuitry 334 or turn-on circuitry 336 is to be able to draw current.

Although some embodiments are not limited in this regard, some or all of pull-up transistors 322 and/or some or all of pull-down transistors 332 are each coupled to a respective ballast resistor. By way of illustration and not limitation, for each of transistors P1, P2, P3, a respective one of ballast resistors Rpb1, Rpb2, Rpb3 is coupled between a body terminal of the transistor and a source terminal of the transistor. Alternatively or in addition, for each of transistors N1, N2, N3, a respective one of ballast resistors Rnb1, Rnb2, Rnb3 is coupled between a body terminal of the transistor and a source terminal of the transistor. Such ballast resistors facilitate parasitic bipolar junction transistor (BJT) characteristics of some or all of pull-up transistors 322 and/or of some or all of pull-down transistors 332. In one such embodiment, a given one of one of ballast resistors Rpb1, Rpb2, Rpb3 or ballast resistors Rnb1, Rnb2, Rnb3 has a resistance is in a range of 5 kiloOhms (kΩ) and 15 kΩ—e.g., wherein the resistance is substantially equal to 10 kΩ. However, other embodiments have alternative ballast resistors, or omit some or all such ballast resistors.

In various embodiments, protection circuit 310 is variously (re)configurable to operate, at different times, in any of various operational modes comprising a first mode wherein pull-down transistors 332 is configured—e.g., based on the detection of an ESD event—to provide a conductive path for an ESD current. For example, in the first mode, each of the NMOS transistors N1, N2, N3 is in a respective active ("on") state—e.g., while each of the PMOS transistors P1, P2, P3 is in a respective inactive ("off") state. In some embodiments, the various operational modes further comprise a second mode which (for example) protection circuit 310 automatically transitions to—e.g., based on operation of protection circuit 310 according to the first mode. In one such embodiment, transitioning to the second mode comprises inactivating each of the NMOS transistors N1, N2, N3, and activating each of the PMOS transistors P1, P2, P3.

In some embodiments, configuration of the first mode comprises activating one or transistors of pull-up control circuitry 320 or pull-down control circuitry 330, which enables some or all conductive paths of an RC circuit. For example, such an RC circuit comprises one or more impedance elements of voltage divider circuit 305, pull-up control circuitry 320 and/or pull-down control circuitry 330. In one such embodiment, capacitive and resistive properties of the RC circuit determine, at least in part, respective turn off times which limit a duration of pull-down transistors 332 being active. Alternatively or in addition, such capacitive and resistive properties determine, at least in part, respective turn on times which limit a duration of pull-down transistors 332 being inactive.

Figure 4:
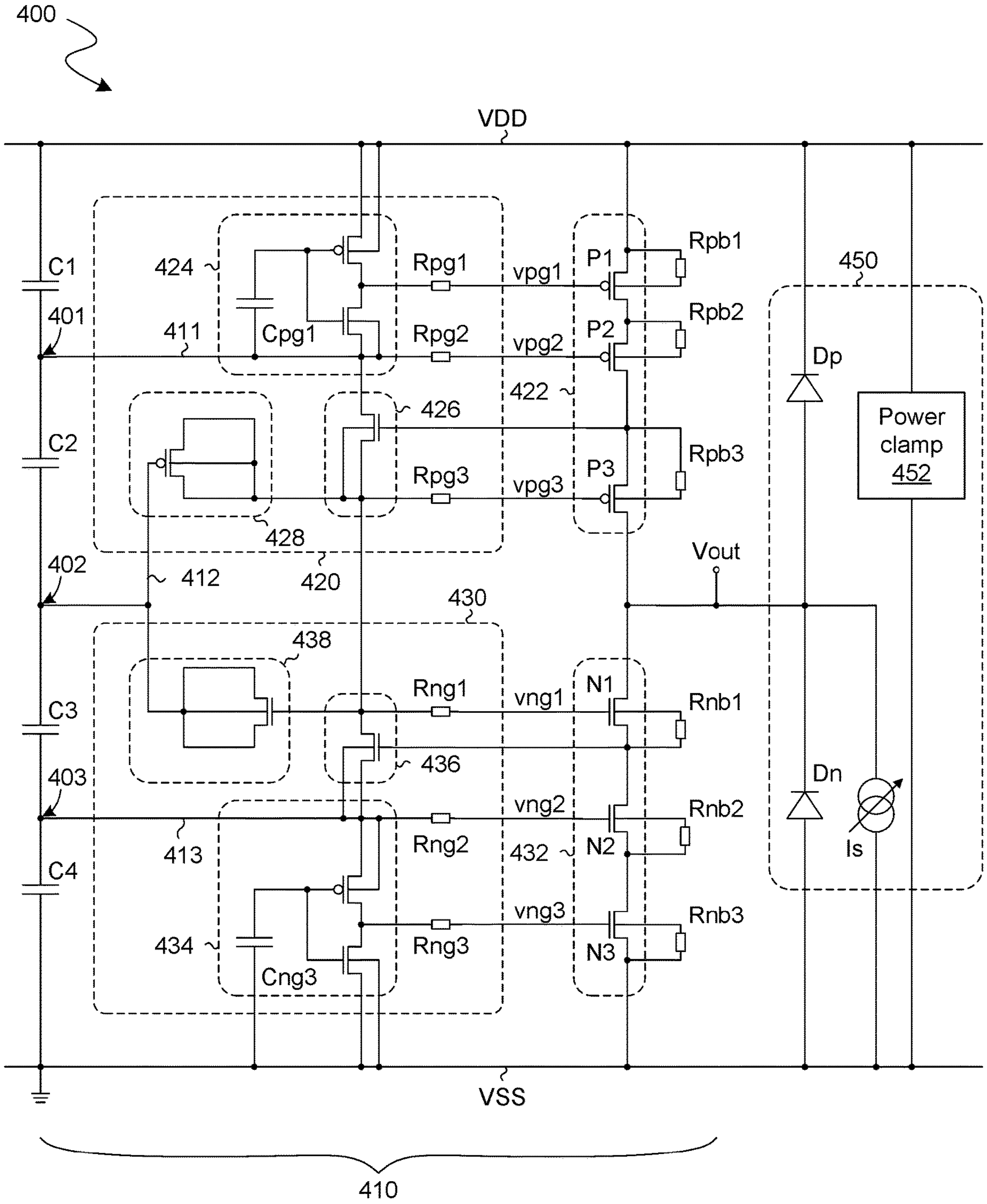
FIG. 4 shows a circuit diagram illustrating features of a device to mitigate damage due to electrostatic discharge according to an embodiment.

FIG. 4 shows a device 400 which mitigates damage due to electrostatic discharge according to an embodiment. Device 400 illustrates features of one example embodiment which, in a particular ESD protection mode, enables current to be conducted in an RC circuit which limits a duration of said ESD protection mode. In some embodiments, device 400 provides functionality such as that of system 100 or device 300—e.g., wherein operations of method 200 are performed with some or all of device 400.

As shown in FIG. 4, device 400 comprises a protection circuit 410 and an ESD network 450 which is coupled to protection circuit 410 via a node (an "output node" herein) with which a voltage Vout is to be output to a load circuit (not shown). In an embodiment, protection circuit 410 and ESD network 450 provide functionality of protection circuit 310 and ESD network 350 (respectively). For example, a voltage divider of protection circuit 410 comprises an in-series arrangement of capacitors C1 through C4 which, for example, provide functionality such as that of voltage divider circuit 105 (or voltage divider circuit 305). The capacitors C1-C4 are coupled in series with each other between a first interconnect which is to receive a supply voltage VDD, and a second interconnect which is to receive another supply voltage VSS (such as a ground voltage or other reference potential). Protection circuit 410 further comprises an in-series arrangement of pull-up transistors 422 and pull-down transistors 432, which are also coupled between the first interconnect and the second interconnect. For example, pull-up transistors 422 comprise PMOS transistors P1, P2, P3 which are coupled in series with each other between the first interconnect and the output node, wherein pull-down transistors 432 comprise NMOS transistors N1, N2, N3 which are coupled in series with each other between the output node and the second interconnect.

In some embodiments, functionality such as that of control circuitry 120 is provided with pull-up control circuitry 420 and pull-down control circuitry 430 of protection circuit 410. In one such embodiment, pull-up control circuitry 420 and pull-down control circuitry 430 correspond functionally to pull-up control circuitry 320 and pull-down control circuitry 330 (respectively). By way of illustration and not limitation, driver circuitry 424 of pull-up control circuitry 420 corresponds functionally to driver circuitry 324—e.g., wherein functionality such as that of turn-on/off circuit 326 is provided with transistors 426, 428 of pull-up control circuitry 420. Furthermore, driver circuitry 434 of pull-down control circuitry 430 corresponds functionally to driver circuitry 334—e.g., wherein functionality such as that of turn-on circuitry 336 is provided with transistors 436, 438 of pull-down control circuitry 430.

In the example embodiment shown, driver circuitry 424 is coupled to receive a signal 411 which (for example) is provided based on a first voltage at a node 401 between capacitors C1, C2. Furthermore, transistors 428, 438 are each coupled to receive a signal 412 which (for example) is provided based on a second voltage at a node 402 between capacitors C2, C3. Further still, driver circuitry 434 is coupled to receive a signal 413 which (for example) is provided based on a third voltage at a node 403 between capacitors C3, C4.

Although some embodiments are not limited in this regard, pull-up transistors 422 are each coupled to a respective one of ballast transistors Rpb1, Rpb2, Rpb3—e.g., wherein pull-down transistors 432 are each coupled to a respective one of other ballast transistors Rnb1, Rnb2, Rnb3. In other embodiments, protection circuit 410 omits some or all such ballast resistors.

In the example embodiment shown, ESD network 450 comprises diodes Dp, Dn and a power clamp 452 which (for example) has some or all of the features of power clamp 152 or power clamp 352. In one such embodiment, protection circuit 410 provides functionality to selectively provide a path for conducting ESD current from ESD network 450 to the second interconnect via the output node to and pull-down transistors 432.

For example, in one such embodiment, signals 411, 413 are provided to the respective gate terminals of transistors P2, N2 (respectively)—e.g., as the illustrative signals vpg2, vng2 shown. Based on signal 411 (signal vpg2), driver circuitry 424 generates another signal vpg1, which is provided to the gate terminal of transistor P1. In the example embodiment shown, driver circuitry 424 comprises an inverter circuit and a capacitor Cpg1 which (for example) helps limit a duration of protection circuit 410 being in an ESD protection mode. Furthermore, based on signal 413 (signal vng2), driver circuitry 434 generates another signal vng3, which is provided to the gate terminal of transistor P3. In the example embodiment shown, driver circuitry 434 comprises an inverter circuit and a capacitor Cng3 which helps limit a duration of protection circuit 410 being in the ESD protection mode.

Further still, transistor 428 provides to the gate terminal of transistor P3 a signal vpg3 which is based on the signal 412. Similarly, transistor 438 provides to the gate terminal of transistors N1 a signal vng1 which is based on the signal 412. In an embodiment, a node between transistors P2. P3 provides a feedback signal to the gate terminal of transistor 426—e.g., wherein another node between transistors N1, N2 provides a feedback signal to the gate terminal of transistor 436. In one such embodiment, transistors 426, 436 provide functionality to selectively enable or disable a conduction of current between driver circuitry 424 and driver circuitry 434.

In an illustrative scenario according to one embodiment, pull-up control circuitry 420 and pull-down control circuitry 430 are configured to detect a spike or other relatively high frequency change to the supply voltage VDD and/or to a current conducted with the first interconnect. Such a change occurs, for example, based on an ESD event which generates a current (represented symbolically as the current source Is shown) which biases diode Dp of ESD network 450 to conduct said current to the first interconnect.

The change to VDD results in a sequence of changes to the respective activation states of one or more transistors of protection circuit 410—e.g., including some or all of transistors 426, 428, 436, 438, transistors of driver circuitry 424 and/or driver circuitry 434, pull-up transistors 422 and pull-down transistors 432.

In one embodiment, an ESD event results in a first mode of protection circuit 410 wherein each of transistors P1, P2, P3 is in a respective inactive ("off") state, and wherein each of transistors N1, N2, N3 is in a respective active ("on") state. Such a first mode provides a path to conduct at least some ESD current from the output terminal the second interconnect via pull-down transistors 432.

In various embodiments, the first mode enables one or more currents to be conducted each in a respective resistor-capacitor (RC) circuit of protection circuit 410. Based on the conduction, protection circuit 410 is able to remain in the first mode for only a limited period of time—e.g., before protection circuit 410 is automatically transitioned from the first mode to some alternative mode. In one such embodiment, the alternative mode disables a path between the output node and the second interconnect via pull-down transistors 432 and (for example) enables a path between the first interconnect and the output node via pull-up transistors 422.

A duration of one particular instance of the first mode is limited, at least in part, due to the respective keep-on times of transistors N1, N2, N3, where said keep-on times are based on RC characteristics of protection circuit 410. In an illustrative scenario according to one embodiment, a keep-on time of transistor N1 is limited based on an RC circuit comprising some or all of a resistor Rng1, and capacitors C3, C4 (e.g., in addition to any resistance and/or capacitance properties of transistor 438). Alternatively or in addition, a keep-on time of transistor N2 is limited based on an RC circuit comprising some or all of a resistor Rng2, and capacitor C4. Alternatively or in addition, a keep-on time of transistor N3 is limited based on an RC circuit comprising some or all of a resistor Rng3 and capacitors Cng2, C4 (e.g., in addition to any resistance and/or capacitance properties of the inverter in driver circuitry 434).

In some embodiments, the duration of said instance of the first mode is additionally or alternatively limited, at least in part, due to the respective keep-off times of transistors P1, P2, P3, where said keep-on times are based on RC characteristics of protection circuit 410. For example, a keep-off time of transistor P1 is limited based on an RC circuit comprising some or all of capacitor Cpg1, a resistance of the transistors of driver circuitry 424, a gate capacitance of transistor P1, resistor Rpg1, and capacitor C1. Alternatively or in addition, a keep-off time of transistor P2 is limited based on an RC circuit comprising some or all of a resistance of the transistors of driver circuitry 424, a gate capacitance of transistor P2, resistor Rpg2, and capacitor C1. Alternatively or in addition, a keep-off time of transistor P3 is limited based on an RC circuit comprising some or all of a resistance of transistor 428, capacitor C2, resistor Rpg3, and capacitor C1.

In various embodiments, the respective capacitances of capacitors C1 and C4 are substantially equal to each other, and the respective capacitances of capacitors C2 and C3 are substantially equal to each other. In one such embodiment, a ratio of capacitor C1 to capacitor C2 (and/or a ratio of capacitor C4 to capacitor C3) is in a range of 1.5 to 3. In an illustrative scenario according to one embodiment, capacitors C1 and C4 are each in a range of 500 picoFarads (pF) to 3 nanoFarads (nF), wherein capacitors C2 and C3 are each in a range of 250 pF to 1.5 nF. In one such embodiment, a resistance of resistor Rng1 is in a range of 50 Ohms (Ω) to 1 kΩ—e.g., wherein a resistance of resistor Rng2 is in a range of 100Ω to 1 kΩ, and a resistance of resistor Rng3 is in a range of 100Ω to 1 kΩ. However, in other embodiments, impedance elements of protection circuit 410 have any of various other suitable capacitances or resistances, according to implementation-specific details.

Figure 5:
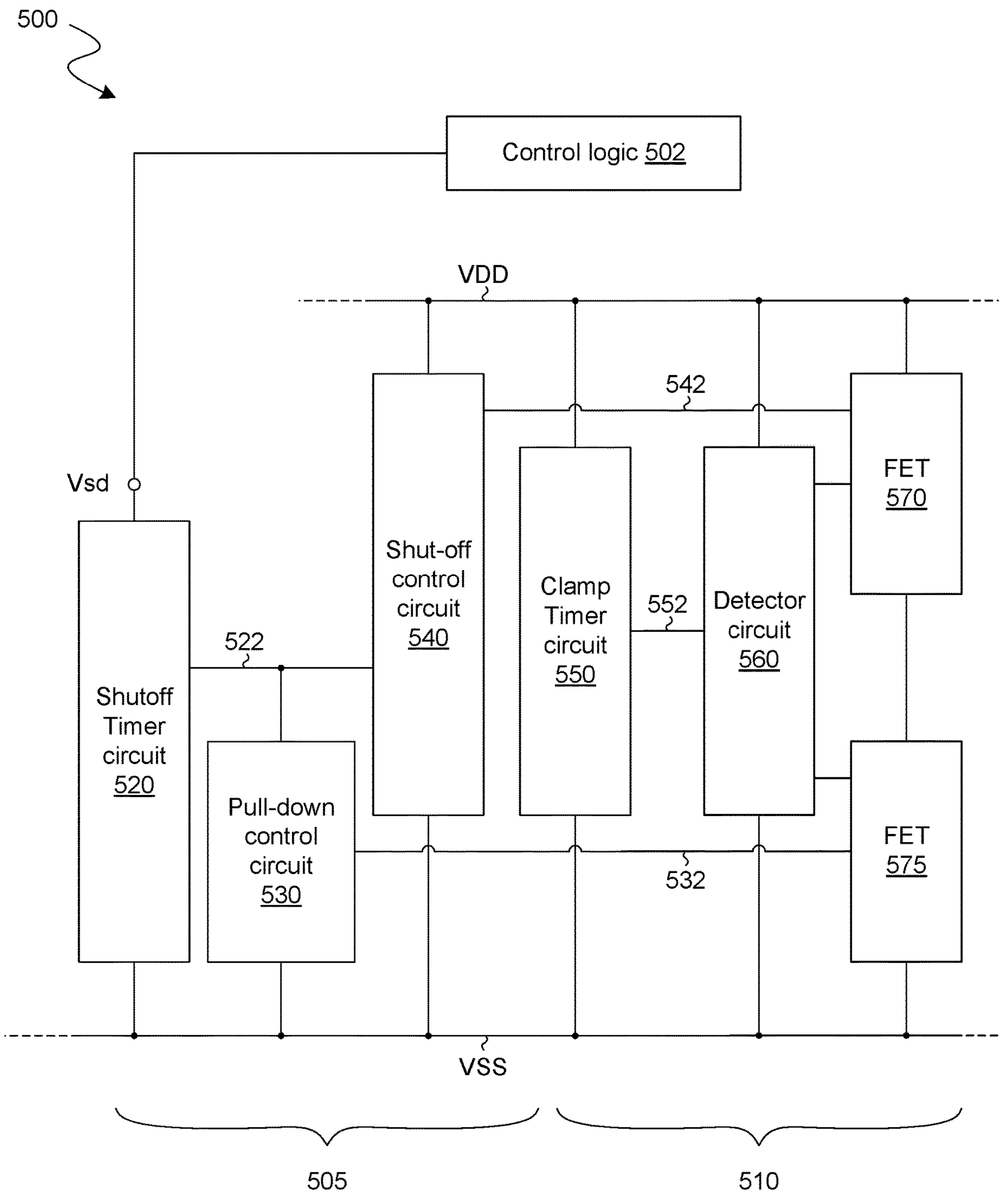
FIG. 5 shows a block diagram illustrating features of a device to selectively enable or disable functionality of a power clamp according to an embodiment.

FIG. 5 shows a device 500 which selectively enables or disables functionality of a power clamp according to an embodiment. Device 500 illustrates features of one example embodiment which is operable to prevent a power clamp circuit from providing a path for conducting an ESD current. In some embodiments, device 500 provides functionality such as that of system 100.

As shown in FIG. 5, device 500 comprises a disable circuit 505 and a power clamp 510 which is coupled thereto. In some embodiments, device 500 further comprises (or alternatively, is to be coupled to) control logic 502 which provides a control signal Vsd to determine whether disable circuit 505 is to disable a functionality of power clamp 510. In some embodiments, power clamp 510 is a clamp circuit such as one of power clamps 152, 352, 452, for example. However, some embodiments variously provide functionality of one of protection circuit 110 or disable circuit 505, but omit functionality of the other one of protection circuit 110 or disable circuit 505.

Power clamp 510 is operable to selectively provide a conductive path by which a current—e.g., such as one generated by an ESD event—is conducted from a relatively high potential conductor to a relatively low potential conductor. In the example embodiment shown, power clamp 510 comprises a field effect transistor (FET) 570 and a FET 575 which are coupled in series with each other between a first interconnect and a second interconnect that, respectively, are to receive a first supply voltage VDD and a second supply voltage VSS (such as a ground voltage or other reference potential).

In one such embodiment, other circuitry of power clamp 510 is operable to detect any of various indicia of an ESD event (or other suitable event)—e.g., wherein power clamp 510 detects a change to the supply voltage VDD. Based on the detected indicia, such circuitry generates one or more signals for activating one or both of FETs 570, 575 to provide a conductive path between the first interconnect and the second interconnect.

For example, power clamp 510 further comprises a clamp timer circuit 550 and a detector circuit 560 which are each also coupled between the first interconnect and the second interconnect—e.g., in parallel with each other, and in parallel with FETs 570, 575. Clamp timer circuit 550 provides functionality to receive a direct or indirect indication of a change to supply voltage VDD—e.g., wherein an RC circuit of clamp timer circuit 550 generates, based on the change, one or more signals 552 which indicate whether the change satisfies a condition for providing a conductive path via FETs 570, 575. For example, the one or more signals 552 indicate whether the voltage change has a component which is above some threshold frequency. In some embodiments, clamp timer circuit 550 subsequently changes some or all of the one or more signals 552 to automatically limit a duration of a period of time during which both of FETs 570, 575 are active. Detector circuit 560 is configured to detect an ESD event based on the one or more signals 552, and in response, to variously operate FETs 570, 575 to provide a conductive path for at least some ESD current.

Disable circuit 505 is configured to selectively allow or prevent the above-described functionality of power clamp 510 by which FET 570 and/or FET 575 are operated to provide a conductive path between the first interconnect and the second interconnect. For example, control signal Vsd comprises an indication from control logic 502 as to whether said functionality is to be enabled or disabled. In an example embodiment, control logic 502 is a component of (or operates with) any of various suitable types of power management hardware or software. Alternatively or in addition, control logic 502 is part of a load circuit which is powered with a DC-DC converter (such as one which comprises protection circuit 110).

In an illustrative scenario according to one embodiment, control signal Vsd is asserted based on control logic 502 determining or otherwise detecting that device 500 is to transition from one power state to another power state. For example, control logic 502 determines that a current (or expected future) power state change could result in an at least temporary change to supply voltage VDD—e.g., where said change is at risk of being incorrectly evaluated as indicating an ESD event. In an embodiment, generation of control signal Vsd includes or is otherwise based on one or more operations which (for example) are adapted from any of various conventional power management techniques. It is to be appreciated that some embodiments are not limited with respect to a particular source from which, or basis upon which, control signal Vsd is generated.

In the example embodiment shown, device 500 comprises a shutoff timer circuit 520, a pull-down control circuit 530, and a shut-off control circuit 540. Shutoff timer circuit 520 provides a filter functionality which, for example, generates a signal 522 that represents a filtered version of control signal Vsd. In one such embodiment, shutoff timer circuit 520 mitigates the possibility of a spurious change to control signal Vsd resulting in an unintended disabling of power clamp 510 (especially during an ESD event, for example).

In one such embodiment, the signal 522 is provided to each of pull-down control circuit 530 and shut-off control circuit 540. Pull-down control circuit 530 provides functionality to generate, based on signal 522, one or more signals—such as the illustrative signal 532 shown—which are to selectively pull-down a gate terminal of FET 575 (or to otherwise prevent activation of FET 575). Shut-off control circuit 540 provides functionality to generate, based on signal 522, one or more other signals—such as the illustrative signal 542 shown—which are to selectively prevent activation of FET 570. In one example embodiment, the one or more other signals (illustrated by signal 542) comprises a first signal which is provided to a gate terminal of FET 570, and a second signal which is provided to a source terminal of FET 570.

Figure 6:
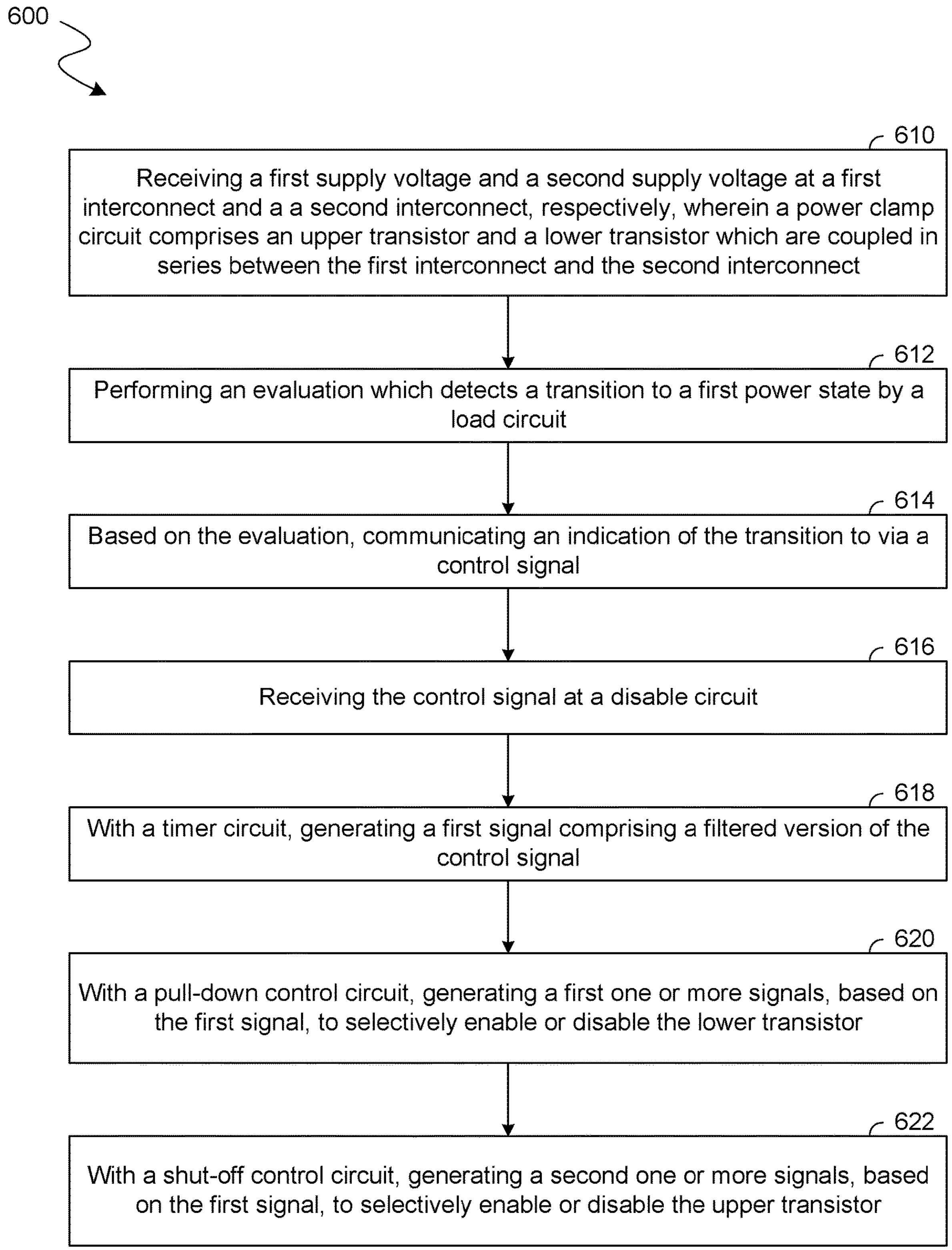
FIG. 6 shows a flow diagram illustrating features of a method to control operation of a power clamp circuit according to an embodiment.

FIG. 6 shows a method 600 for controlling operation of a power clamp circuit according to an embodiment. Operations such as those of method 600 are performed with any of various combinations of suitable hardware (e.g., circuitry) and/or executing software which, for example, provide some or all of the functionality of device 500. The illustrative method 600 shows operations which are variously performed with a controller, a power clamp circuit, and a disable circuit. However, other embodiments comprise operations which are performed with only one (or, for example, only two) of such a controller, power clamp circuit, and disable circuit.

As shown in FIG. 6, method 600 comprises (at 610) receiving a first supply voltage and a second supply voltage at a first interconnect and a second interconnect, respectively. In an embodiment, a power clamp circuit (such as power clamp 510) comprises an upper transistor and a lower transistor which are coupled in series with each other between the first interconnect and the second interconnect.

In some embodiments, method 600 further comprises (at 612) performing an evaluation—e.g., at a controller such as control logic 502—which detects a transition to a first power state by a load circuit. For example, the evaluation at 612 detects that a processor (and/or one or more other components) of the load circuit is undergoing a power state transition, or is expected to undergo a future power state transition. In one such embodiment, based on the evaluation performed at 612, method 600 (at 614) communicates an indication of the transition, via a control signal, to a disable circuit which is coupled to the controller. Method 600 further comprises (at 616) receiving the control signal at the disable circuit (e.g., at disable circuit 505).

Method 600 further comprises (at 618) generating a first signal with a timer circuit of the disable circuit, wherein the first signal comprises a filtered—e.g., a low pass filtered—version of the control signal. Method 600 further comprises (at 620) generating a first one or more signals, based on the first signal, with a pull-down control circuit of the disable circuit. In an embodiment, the first one or more signals are provided to selectively enable or disable the lower transistor.

Method 600 further comprises (at 622) generating a second one or more signals, based on the first signal, with a shut-off control circuit. In one such embodiment, the second one or more signals are provided to selectively enable or disable the upper transistor.

In an illustrative scenario according to one embodiment, the shut-off control circuit comprises a voltage divider which comprises two resistors coupled in series with each other between the first interconnect and the second interconnect. The shut-off control circuit further comprises an inverter circuit which is coupled between a first node, which is between the two resistors, and the second interconnect. In one such embodiment, the inverter circuit is further coupled to receive the first signal, and to generate a second signal based on the first signal. The shut-off control circuit further comprises a first transistor, coupled between the first node and a gate terminal of the upper transistor, a second transistor which is coupled between the first node and another terminal (e.g., a source terminal) of the upper transistor.

In an embodiment, respective gate terminals of the first transistor and the second transistor are each coupled to receive the second signal. In one such embodiment, the first transistor and the second transistor are PMOS transistors, wherein respective body terminals of the first transistor and the second transistor are each coupled to receive the first supply voltage. In an embodiment, the pull-down control circuit comprises a third transistor which is coupled between a gate terminal of the lower transistor and the second interconnect, wherein a gate terminal of the third transistor is coupled to receive the first signal. In one such embodiment, the third transistor is an NMOS transistor, and wherein a body terminal of the third transistor and the second transistor are each coupled to receive the second supply voltage. In an embodiment, the inverter circuit comprises a PMOS transistor and an NMOS transistor, wherein a body terminal of the PMOS transistor is coupled to receive the first supply voltage. In one such embodiment, a body terminal of the NMOS transistor is coupled to receive the second supply voltage.

Figure 7A:
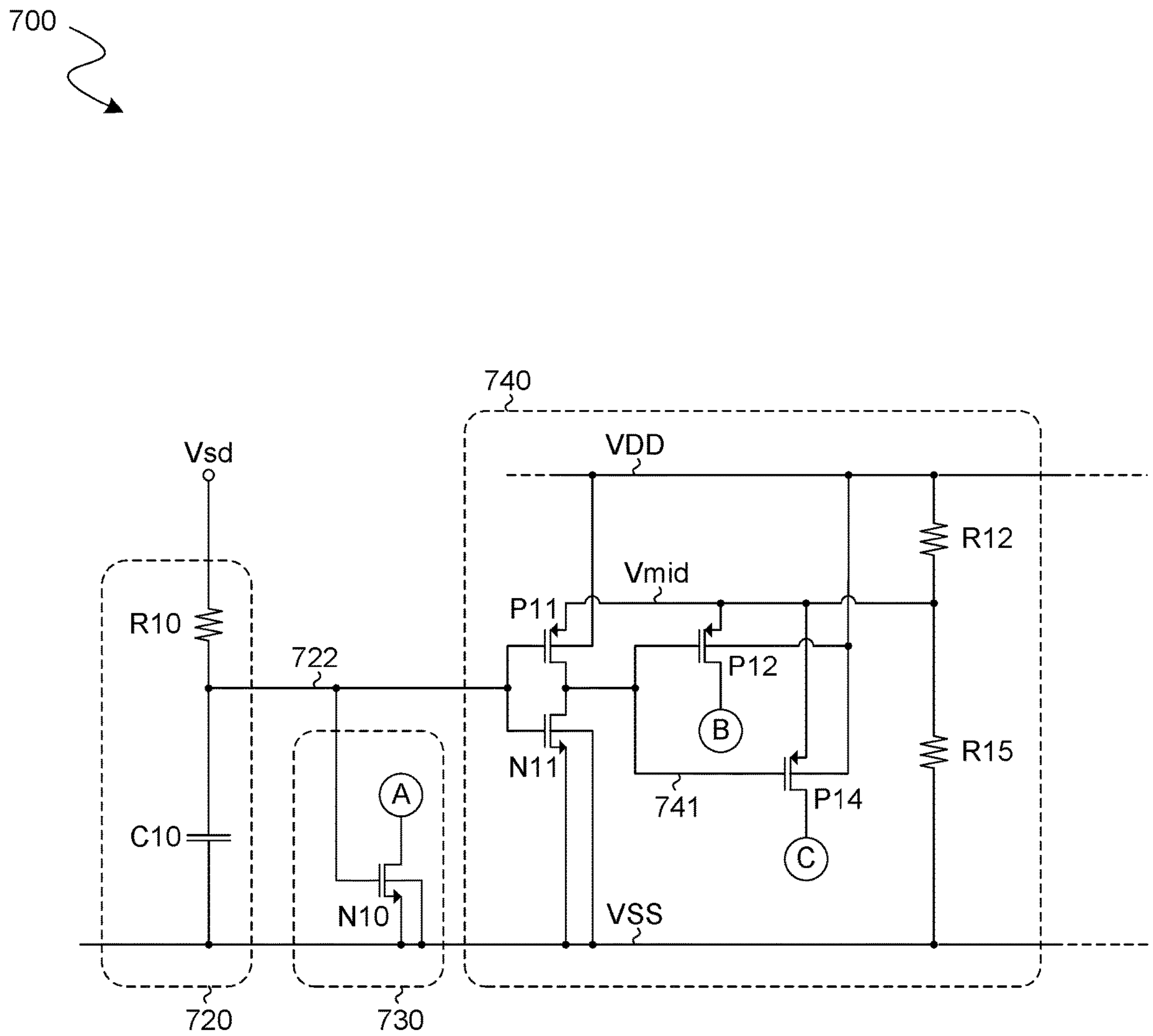
FIG. 7A shows a circuit diagram illustrating features of a disable circuit to control a power clamp according to an embodiment.
Figure 7B:
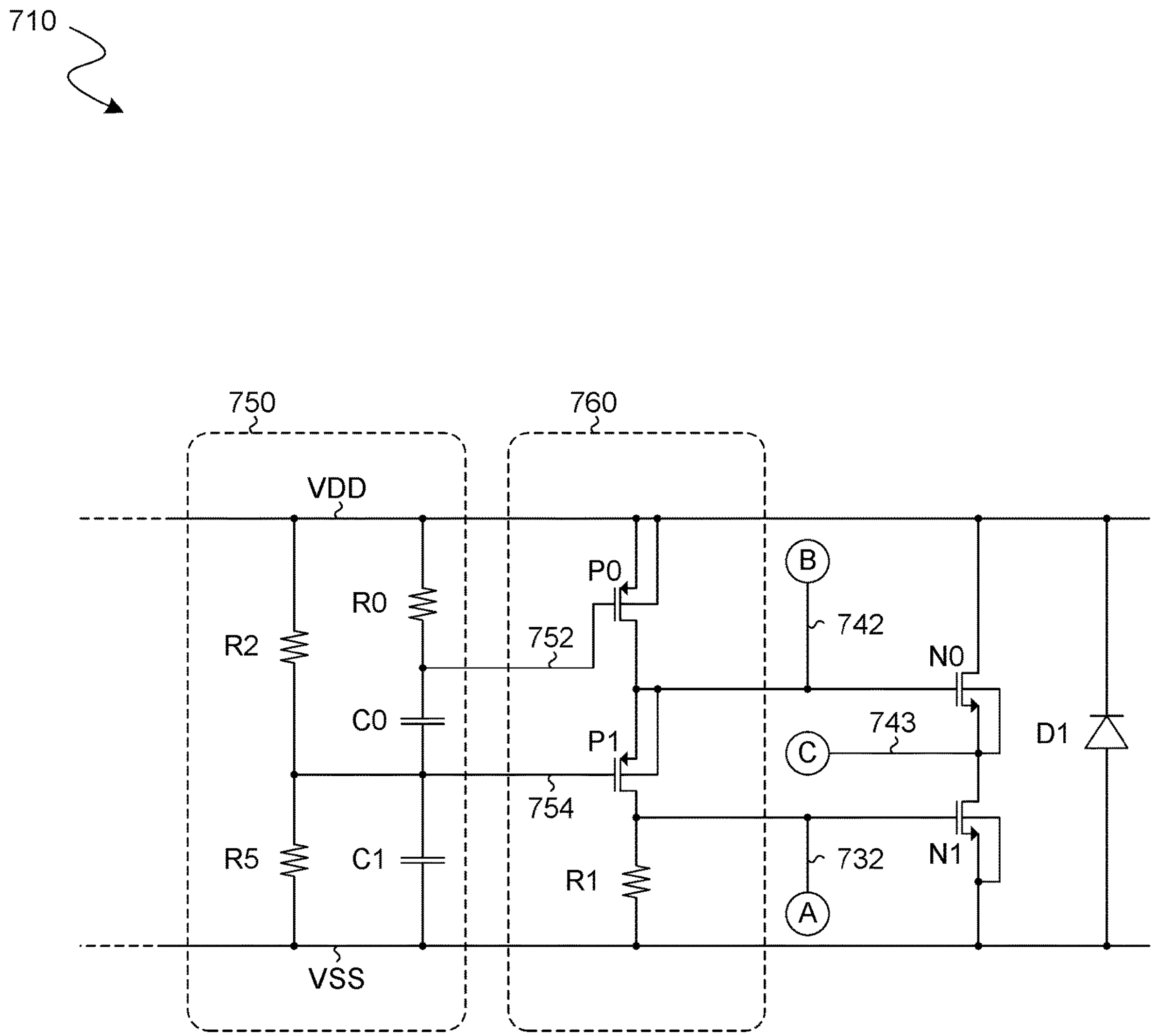
FIG. 7B shows a circuit diagram illustrating features of a power clamp which is to be selectively controlled with a disable circuit according to an embodiment.

FIG. 7A shows a disable circuit 700 which controls a power clamp according to an embodiment. Disable circuit 700 illustrates features of one example embodiment which is operable to prevent a power clamp from providing a conductive part for conducting an ESD current. FIG. 7B shows one example of a power clamp 710 which accommodates being selectively controlled with disable circuit 700 according to an embodiment. In some embodiments, disable circuit 700 and power clamp 710 correspond functionally to disable circuit 505 and power clamp 510 (respectively)—e.g., wherein one or more operations of method 600 are performed with disable circuit 700 and/or power clamp 710.

As shown in FIG. 7A, disable circuit 700 comprises a timer circuit 720 and a pull-down control circuit 730 which is coupled to timer circuit 720. Disable circuit 700 further comprises a shut-off control circuit 740 that is coupled to timer circuit 720 and pull-down control circuit 730. In an embodiment, shut-off control circuit 740 is coupled between a first interconnect and a second interconnect, which are to receive, respectively, a supply voltage VDD and another supply voltage VSS (such as a ground voltage or other reference potential).

Timer circuit 720 illustrates any of various filter circuit which are suitable to receive a control signal Vsd which indicates whether a power clamp (such as power clamp 710) is to be disabled from providing a path for conducting an ESD current. In the example embodiment shown, timer circuit 720 comprises a resistor R10 and a capacitor C10 which are coupled in series with each other between an input terminal (or other suitable contact) by which disable circuit 700 receives the control signal Vsd. Pull-down control circuit 730 comprises a transistor N10 which is coupled between a first node (represented by the symbol A shown) and the second interconnect.

In the example embodiment shown, shut-off control circuit 740 comprises resistors R12, R15 which are coupled, in a voltage divider configuration between the first interconnect and the second interconnect, to provide a voltage Vmid which is between the respective levels of supply voltages VDD. VSS. Shut-off control circuit 740 further comprises a PMOS transistor P11 and an NMOS transistor N11 which are configured together to provide an inverter circuit between the voltage Vmid and the second interconnect. Furthermore, shut-off control circuit 740 comprises a PMOS transistor P12 which is coupled between the voltage Vmid and a second node (represented by the symbol B shown). Further still, shut-off control circuit 740 comprises another PMOS transistor P14 which is coupled between the voltage Vmid and a third node (represented by the symbol C shown).

Referring now to FIG. 7B, power clamp 710 comprises NMOS transistors N0, N1 which are coupled in series with each other between the first interconnect and the second interconnect. Power clamp 710 further comprises a clamp timer circuit 750 and a detector circuit 760 which are also coupled between the first interconnect and the second interconnect. In an embodiment, transistors N0, N1 provide functionality of FET 570 and FET 575 (respectively)—e.g., wherein clamp timer circuit 750 and detector circuit 760 correspond functionally to clamp timer circuit 550 and detector circuit 560, respectively. As shown in FIG. 7B, the first node (represented by the symbol A) extends to a gate terminal of transistor N1. Furthermore, the second node extends to a gate terminal of transistor N0—e.g., wherein the third node is between transistors N0, N1. In the example embodiment shown, power clamp 710 further comprises a diode D1 which is coupled in parallel with the circuit path comprising transistors N0, N1.

In one such embodiment, clamp timer circuit 750 comprises an RC network which includes resistors R0, R2, R5 and capacitors C0, C1. Detector circuit 760 comprises PMOS transistors P0, P1 which are coupled to variously receive respective signals 752, 754 from clamp timer circuit 750. When power clamp 710 is functional—i.e., when disable circuit 700 does not prevent said functionality based on control signal Vsd—detector circuit 760 is operable to selectively determine respective activation states of transistors N0, N1 based on signals 752, 754.

In an illustrative scenario according to one embodiment, capacitor C10 has a capacitance which is in a range of 1 picoFarads (pF) to 5 pF—e.g., wherein a resistance of resistor R10 is in a range of 200 kiloOhms (kΩ) to 2 MegaOhms (MΩ). In one such embodiment, a resistance of resistor R12 is in a range of 1 MΩ to 10 MΩ, and a resistance of resistor R15 is in a range of 1 MΩ to 10 MΩ. In some embodiments, the RC circuit time constant of timer circuit 720 is greater than an expected time window of an ESD event. In one such embodiment, the time constant is greater than 500 nanoseconds (ns). However, in other embodiments, impedance elements of disable circuit 700 have any of various other suitable capacitances or resistances, according to implementation-specific details.

Alternatively or in addition, capacitor C0 has a capacitance which is in a range of 1 pF to 10 pF, and capacitor C1 has a capacitance which is in a range of 1 pF to 10 pF—e.g., wherein a resistance of resistor R0 is in a range of 100 kΩ to 1 MΩ, a resistance of resistor R2 is in a range of 1 MΩ to 10 MΩ, and a resistance of resistor R5 is in a range of 1 MΩ to 10 MΩ. In one such embodiment, a resistance of resistor R1 is in a range of 1 kΩ to 5 kΩ. However, in other embodiments, impedance elements of power clamp 710 have any of various other suitable capacitances or resistances, according to implementation-specific details.

In an illustrative scenario according to one embodiment, timer circuit 720 provides a signal 722, based on control signal Vsd, which is equal to (or otherwise based on) a voltage at a node between resistor R10 and capacitor C10. Signal 722 represents a filtered (e.g., low pass) version of control signal Vsd—e.g., to mitigate the possibility of noise in control signal Vsd resulting in an unintended disabling of power clamp 710.

Signal 722 is provided both to pull-down control circuit 730 and shut-off control circuit 740. In an embodiment, an assertion of control signal Vsd (and, correspondingly, of signal 722)—e.g., to indicate a detected power state transition-results in activation of transistor N10, which in turn pulls down a signal 732 at the gate terminal of the lower (e.g., a pull-down) transistor N1. In one such embodiment, the assertion of signal 722 further results in the deassertion of a complementary signal 741, which is provided by the inverter circuit to each of PMOS transistors P12, P14. In an embodiment, deassertion of signal 741 activates each of transistors P12, P14, which deactivates upper transistor N0—e.g., by providing substantially equal voltage levels of signals 742, 743 at the second node and third node (respectively) to reduce a source-to-gate voltage at upper transistor N0.

Figure 8:
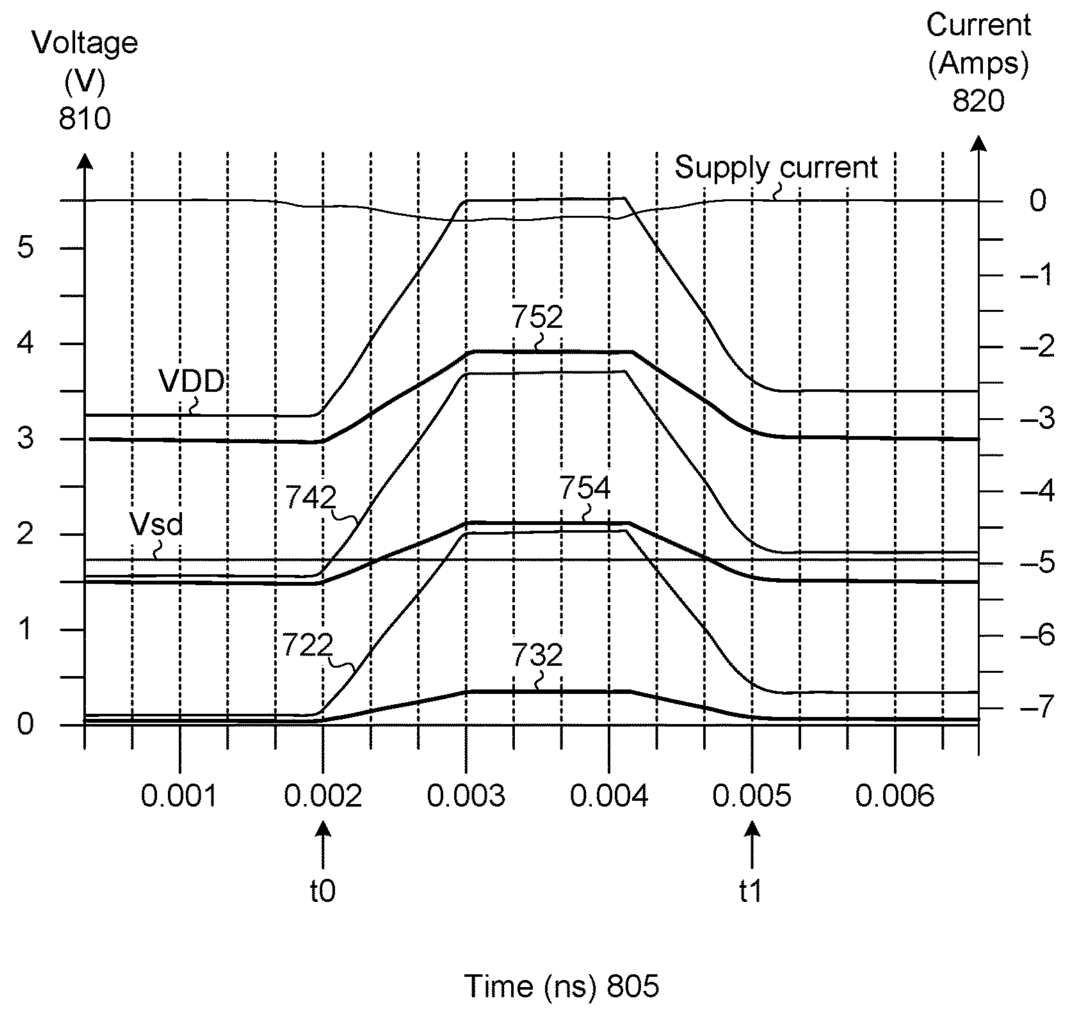
FIG. 8 shows a timing diagram illustrating operations performed with a disable circuit according to an embodiment.

FIG. 8 shows a graph 800 which illustrates operations performed with disable circuit 700 and power clamp 710 and a power clamp according to one example embodiment. Graph 800 shows an example of operational features which are exhibited during a period of time 805. More particularly, graph 800 comprises a first axis 810 for various voltages at disable circuit 700 and power clamp 710, and a second axis 820 for a supply current which (for example) is provided by the voltage converter circuit that is coupled to disable circuit 700 and power clamp 710.

As shown in FIG. 8, at a time to, supply voltage VDD experiences a perturbance which (for example) is due to a power state transition of a load circuit which is powered by a DC-DC voltage converter. In anticipation of the perturbance, a controller (such as control logic 502 or any of various other suitable control resources) asserts control signal Vsd at some earlier time. For example, control signal Vsd is asserted so that, by time t0, control signal Vsd has increased to a sufficiently high level (in this example scenario, 1.8 V) to disable the upper transistor N0 and the lower transistor N1 of power clamp 710.

The perturbance of supply voltage VDD (which, in this example scenario, lasts to the time t1 shown) results in corresponding changes to voltage Vmid, and to signals 752, 754. Due to the assertion of control signal Vsd, which results in activation of transistor N10, an increase (if any) to the signal 732 at the first node is insufficient to activate pull-down transistor N1. Furthermore, assertion of control signal Vsd results in signals 742, 743 being substantially equal to each other, which—in turn—prevents activation of upper transistor N0.

Figure 9:
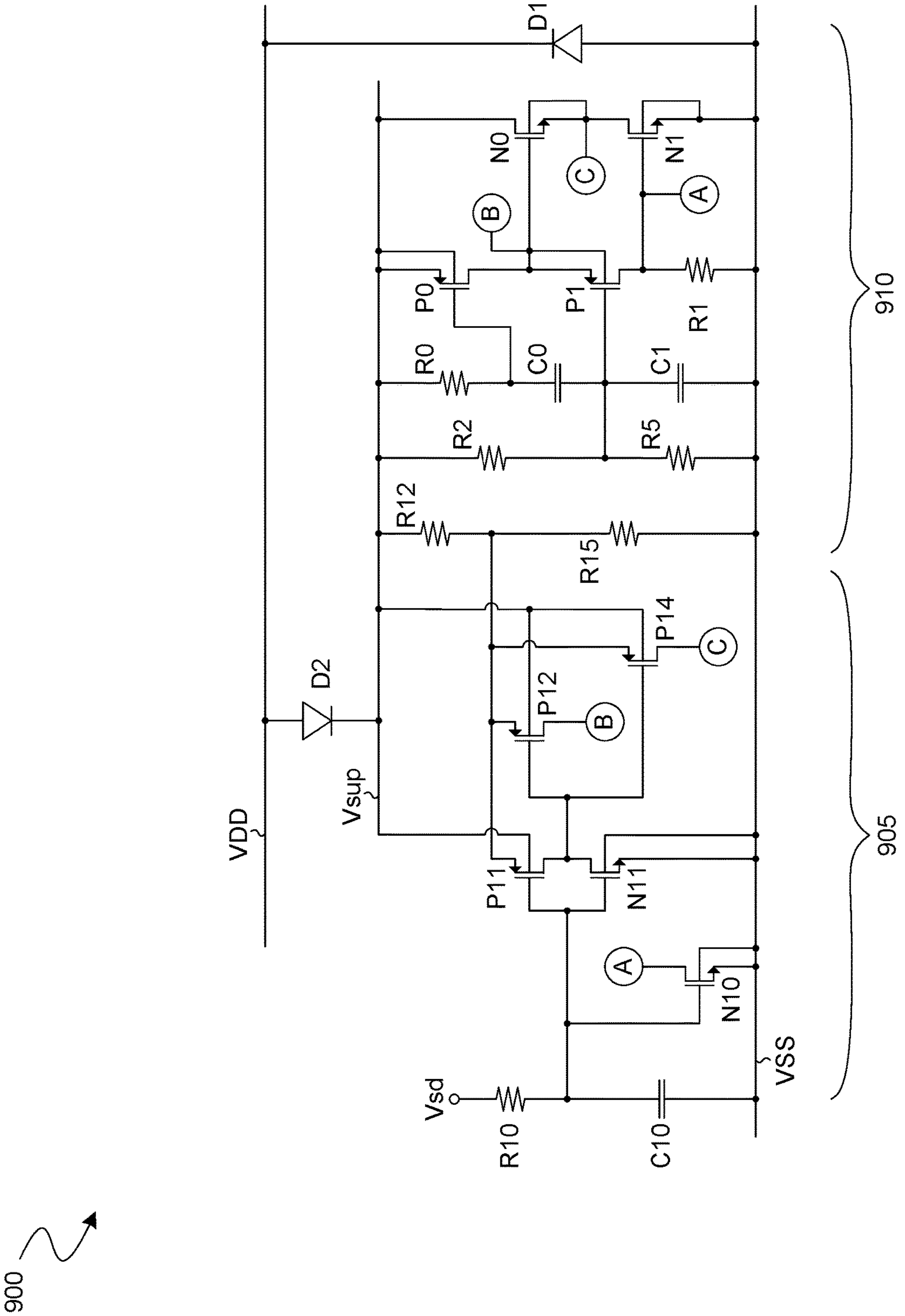
FIG. 9 shows a circuit diagram illustrating features of a device to provide electrostatic discharge protection according to an embodiment.

FIG. 9 shows a device 900 which provides electrostatic discharge protection according to an embodiment. Device 900 illustrates features of one example embodiment which mitigates a draw of current from a voltage supply due to an electrostatic discharge event. In some embodiments, device 900 provides functionality such as that of device 500, or (for example) that of a combination of disable circuit 700 and power clamp 710. In one such embodiment, operations of method 600 are performed with device 900.

As shown in FIG. 9, device 900 comprises a disable circuit 905 and a power clamp 910 which is coupled to disable circuit 905. Disable circuit 905 provides functionality such as that of disable circuit 505 or disable circuit 700—e.g., wherein power clamp 910 provides functionality such as that of power clamp 510 or power clamp 710.

In one such embodiment, a first interconnect of device 900 is configured to receive a first supply voltage VDD, wherein a second interconnect of device 900 is configured to receive a second supply voltage (VSS) which, for example, is a ground voltage or other reference potential. Device 900 further comprises an input terminal by which a control signal Vsd is received to selectively enable or disable functionality of power clamp 910 with disable circuit 905.

Whereas various respective circuit elements of disable circuit 700 and power clamp 710 are each directly coupled to an interconnect which receives a supply voltage VDD, circuit elements of disable circuit 905 and power clamp 910 are only indirectly coupled to the first interconnect via a diode D2, and a third interconnect which provides a voltage Vsup based on the supply voltage VDD.

Other than this difference, disable circuit 905 is shown as having a similar circuit architecture to that of disable circuit 700, and power clamp 910 is shown as having a similar circuit architecture to that of power clamp 710. Some embodiments, in coupling some or all circuit elements of disable circuit 905 and power clamp 910 to the first interconnect via the diode D2 and the third interconnect, further reduce current draw from a voltage supply. Additionally or alternatively, such embodiments variously increase robustness against voltage supply overshoots.

Figure 10:
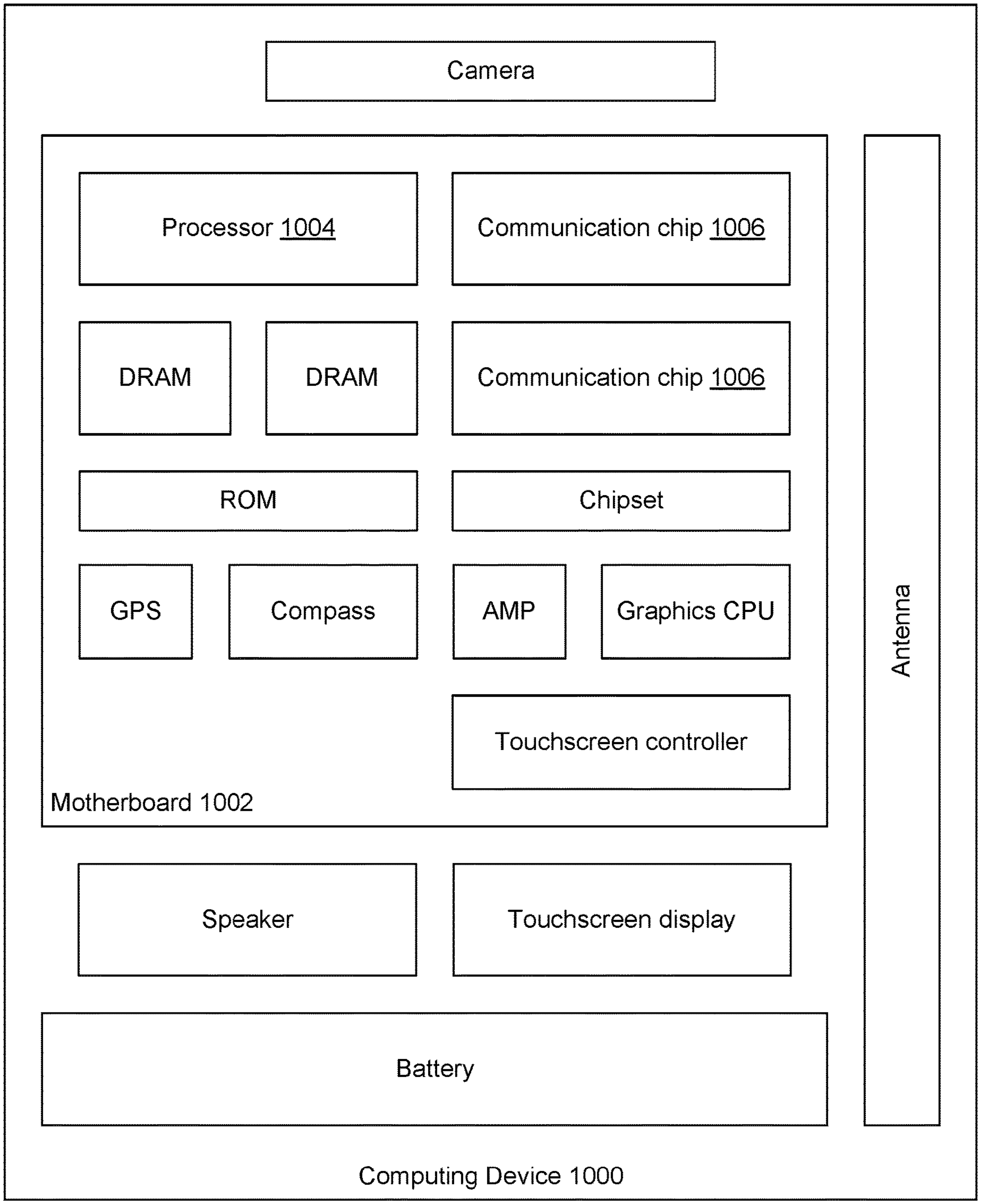
FIG. 10 is a functional block diagram illustrating a computing device in accordance with one embodiment.

FIG. 10 illustrates a computing device 1000 in accordance with one embodiment. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX. LTE, Ev-DO, and others.

The processor 1004 of the computing device 1000 includes an integrated circuit die packaged within the processor 1004. The term "processor" may refer to any device or portion of a device that processes electronic data from registers and/or memory to transform that electronic data into other electronic data that may be stored in registers and/or memory. The communication chip 1006 also includes an integrated circuit die packaged within the communication chip 1006.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 11:
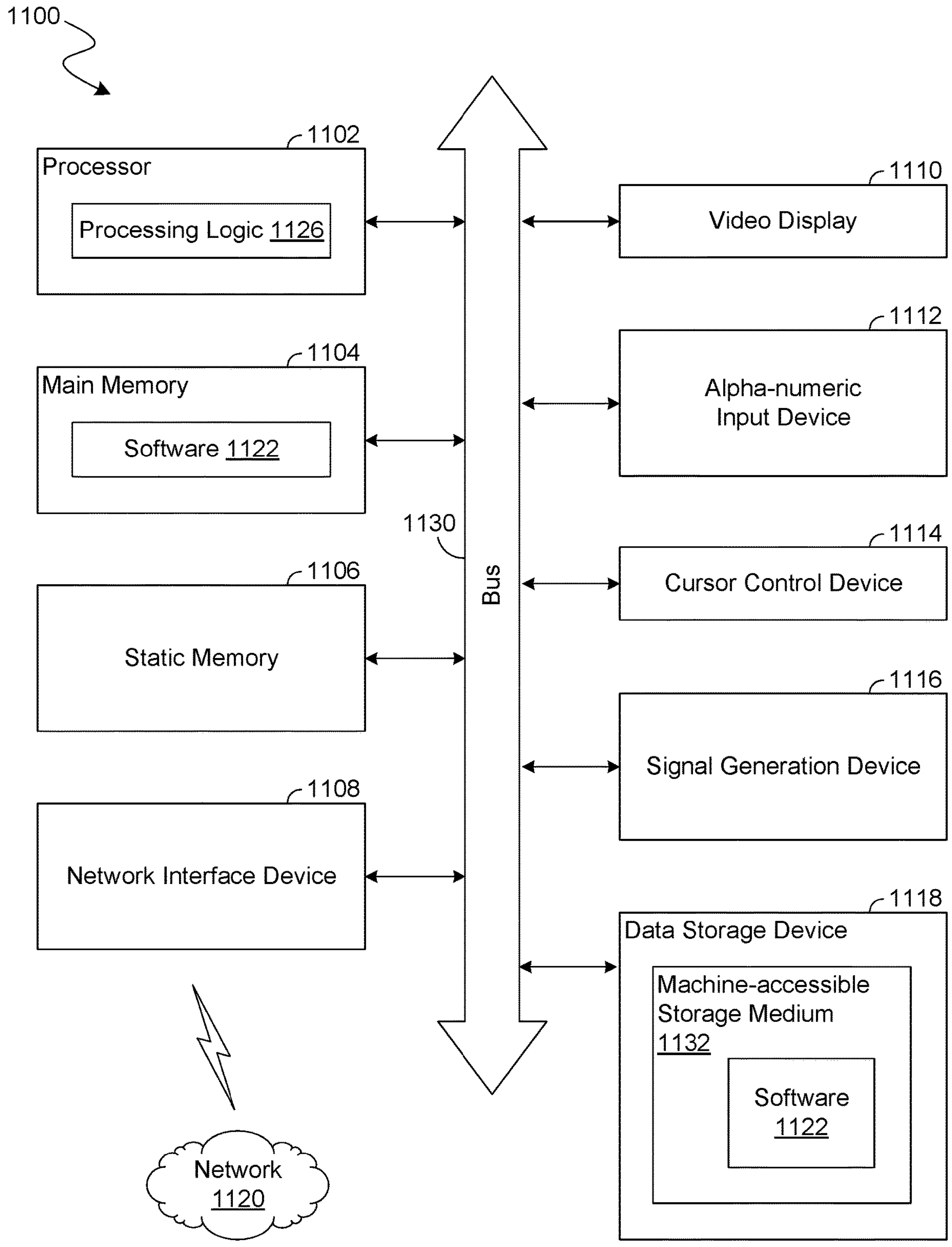
FIG. 11 is a functional block diagram illustrating an exemplary computer system, in accordance with one embodiment.

FIG. 11 illustrates a diagrammatic representation of a machine in the exemplary form of a computer system 1100 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1100 includes a processor 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM), etc.), and a secondary memory 1118 (e.g., a data storage device), which communicate with each other via a bus 1130.

Processor 1102 represents one or more general-purpose processing devices such as a microprocessor, central processing unit, or the like. More particularly, the processor 1102 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1102 may also be one or more special-purpose processing devices such as an application specific integrated circuit (ASIC), a field programmable gate array (FPGA), a digital signal processor (DSP), network processor, or the like. Processor 1102 is configured to execute the processing logic 1126 for performing the operations described herein.

The computer system 1100 may further include a network interface device 1108. The computer system 1100 also may include a video display unit 1110 (e.g., a liquid crystal display (LCD), a light emitting diode display (LED), or a cathode ray tube (CRT)), an alphanumeric input device 1112 (e.g., a keyboard), a cursor control device 1114 (e.g., a mouse), and a signal generation device 1116 (e.g., a speaker).

The secondary memory 1118 may include a machine-accessible storage medium (or more specifically a computer-readable storage medium) 1132 on which is stored one or more sets of instructions (e.g., software 1122) embodying any one or more of the methodologies or functions described herein. The software 1122 may also reside, completely or at least partially, within the main memory 1104 and/or within the processor 1102 during execution thereof by the computer system 1100, the main memory 1104 and the processor 1102 also constituting machine-readable storage media. The software 1122 may further be transmitted or received over a network 1120 via the network interface device 1108.

While the machine-accessible storage medium 1132 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one or more first embodiments, a device comprises a power clamp circuit comprising an upper transistor coupled to a first interconnect which is to receive a first supply voltage, and a pull-down transistor coupled between the upper transistor and a second interconnect which is to receive a second supply voltage, a disable circuit comprising a timer circuit to receive a control signal and to generate a first signal comprising a filtered version of the control signal, a pull-down control circuit coupled to receive the first signal from the timer circuit and, based on the first signal, to generate a first one or more signals to selectively enable or disable the pull-down transistor, and a shut-off control circuit coupled to receive the first signal from the timer circuit, and, based on the first signal, to generate a second one or more signals to selectively enable or disable the upper transistor.

In one or more second embodiments, further to the first embodiment, the device further comprises a controller coupled to the disable circuit, the controller comprising circuitry to perform an evaluation which detects a transition to a first power state by a load circuit, and based on the evaluation, communicate an indication of the transition to the disable circuit via the control signal, wherein the disable circuit is to disable the upper transistor and the pull-down transistor based on the indication.

In one or more third embodiments, further to the first embodiment or the second embodiment, the shut-off control circuit comprises a voltage divider comprising two resistors coupled in series with each other between the first interconnect and the second interconnect, an inverter circuit coupled between the second interconnect and a first node between the two resistors, wherein the inverter circuit is further coupled to receive the first signal and to generate a second signal based on the first signal, a first transistor coupled between the first node and a gate terminal of the upper transistor, and a second transistor coupled between the first node and another terminal of the upper transistor.

In one or more fourth embodiments, further to the third embodiment, respective gate terminals of the first transistor and the second transistor are each coupled to receive the second signal.

In one or more fifth embodiments, further to the fourth embodiment, the first transistor and the second transistor are PMOS transistors, wherein respective body terminals of the first transistor and the second transistor are each coupled to receive the first supply voltage.

In one or more sixth embodiments, further to the third embodiment, the pull-down control circuit comprises a third transistor which is coupled between a gate terminal of the pull-down transistor and the second interconnect, wherein a gate terminal of the third transistor is coupled to receive the first signal.

In one or more seventh embodiments, further to the sixth embodiment, the third transistor is an NMOS transistor, and wherein a body terminal of the third transistor and the second transistor are each coupled to receive the second supply voltage.

In one or more eighth embodiments, further to the third embodiment, the inverter circuit comprises a PMOS transistor and an NMOS transistor, wherein a body terminal of the PMOS transistor is coupled to receive the first supply voltage.

In one or more ninth embodiments, further to the eighth embodiment, a body terminal of the NMOS transistor is coupled to receive the second supply voltage.

In one or more tenth embodiments, a method comprises receiving a first supply voltage and a second supply voltage at a first interconnect and a a second interconnect, respectively, wherein a power clamp circuit comprises an upper transistor coupled to the first interconnect, and a pull-down transistor coupled between the upper transistor and the second interconnect, receiving at a disable circuit a control signal, with a timer circuit of the disable circuit, generating a first signal comprising a filtered version of the control signal, with a pull-down control circuit of the disable circuit, generating a first one or more signals, based on the first signal, to selectively enable or disable the pull-down transistor, and with a shut-off control circuit of the disable circuit, generating a second one or more signals, based on the first signal, to selectively enable or disable the upper transistor.

In one or more eleventh embodiments, further to the tenth embodiment, the method further comprises performing, at a controller circuit, an evaluation which detects a transition to a first power state by a load circuit, based on the evaluation, communicating an indication of the transition to the disable circuit via the control signal, wherein the disable circuit disables the upper transistor and the pull-down transistor based on the indication.

In one or more twelfth embodiments, further to the tenth embodiment or the eleventh embodiment, the shut-off control circuit comprises a voltage divider comprising two resistors coupled in series with each other between the first interconnect and the second interconnect, an inverter circuit coupled between the second interconnect and a first node between the two resistors, wherein the inverter circuit receives the first signal and generates a second signal based on the first signal, a first transistor coupled between the first node and a gate terminal of the upper transistor, and a second transistor coupled between the first node and another terminal of the upper transistor.

In one or more thirteenth embodiments, further to the eleventh embodiment, respective gate terminals of the first transistor and the second transistor are each coupled to receive the second signal.

In one or more fourteenth embodiments, further to the thirteenth embodiment, the first transistor and the second transistor are PMOS transistors, wherein respective body terminals of the first transistor and the second transistor are each coupled to receive the first supply voltage.

In one or more fifteenth embodiments, further to the eleventh embodiment, the pull-down control circuit comprises a third transistor which is coupled between a gate terminal of the pull-down transistor and the second interconnect, wherein a gate terminal of the third transistor is coupled to receive the first signal.

In one or more sixteenth embodiments, further to the fifteenth embodiment, the third transistor is an NMOS transistor, and wherein a body terminal of the third transistor and the second transistor are each coupled to receive the second supply voltage.

In one or more seventeenth embodiments, further to the eleventh embodiment, the inverter circuit comprises a PMOS transistor and an NMOS transistor, wherein a body terminal of the PMOS transistor is coupled to receive the first supply voltage.

In one or more eighteenth embodiments, further to the seventeenth embodiment, a body terminal of the NMOS transistor is coupled to receive the second supply voltage.

In one or more nineteenth embodiments, a system comprises a voltage converter coupled to receive a first supply voltage and a second supply voltage via a first interconnect and a second interconnect, respectively, the voltage converter further to generate at an output node an output voltage based on the first supply voltage and the second supply voltage, a load circuit coupled to receive the output voltage from the output node, a power clamp circuit comprising an upper transistor coupled to the first interconnect, and a pull-down transistor coupled between the upper transistor and the second interconnect, a disable circuit comprising a timer circuit to receive a control signal and to generate a first signal comprising a filtered version of the control signal, a pull-down control circuit coupled to receive the first signal from the timer circuit and, based on the first signal, to generate a first one or more signals to selectively enable or disable the pull-down transistor, and a shut-off control circuit coupled to receive the first signal from the timer circuit, and, based on the first signal, to generate a second one or more signals to selectively enable or disable the upper transistor.

In one or more twentieth embodiments, further to the nineteenth embodiment, the system further comprises a controller coupled to the disable circuit, the controller comprising circuitry to perform an evaluation which detects a transition to a first power state by the load circuit, and based on the evaluation, communicate an indication of the transition to the disable circuit via the control signal, wherein the disable circuit is to disable the upper transistor and the pull-down transistor based on the indication.

In one or more twenty-first embodiments, further to the nineteenth embodiment or the twentieth embodiment, the shut-off control circuit comprises a voltage divider comprising two resistors coupled in series with each other between the first interconnect and the second interconnect, an inverter circuit coupled between the second interconnect and a first node between the two resistors, wherein the inverter circuit is further coupled to receive the first signal and to generate a second signal based on the first signal, a first transistor coupled between the first node and a gate terminal of the upper transistor, and a second transistor coupled between the first node and another terminal of the upper transistor.

In one or more twenty-second embodiments, further to the twenty-first embodiment, respective gate terminals of the first transistor and the second transistor are each coupled to receive the second signal.

In one or more twenty-third embodiments, further to the twenty-second embodiment, the first transistor and the second transistor are PMOS transistors, wherein respective body terminals of the first transistor and the second transistor are each coupled to receive the first supply voltage.

In one or more twenty-fourth embodiments, further to the twenty-first embodiment, the pull-down control circuit comprises a third transistor which is coupled between a gate terminal of the pull-down transistor and the second interconnect, wherein a gate terminal of the third transistor is coupled to receive the first signal.

In one or more twenty-fifth embodiments, further to the twenty-fourth embodiment, the third transistor is an NMOS transistor, and wherein a body terminal of the third transistor and the second transistor are each coupled to receive the second supply voltage.

In one or more twenty-sixth embodiments, further to the twenty-first embodiment, the inverter circuit comprises a PMOS transistor and an NMOS transistor, wherein a body terminal of the PMOS transistor is coupled to receive the first supply voltage.

In one or more twenty-seventh embodiments, further to the twenty-sixth embodiment, a body terminal of the NMOS transistor is coupled to receive the second supply voltage.

Techniques and architectures for providing protection from an electrostatic discharge are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device comprising:

a power clamp circuit comprising:

an upper transistor coupled to a first interconnect which is to receive a first supply voltage; and a pull-down transistor coupled between the upper transistor and a second interconnect which is to receive a second supply voltage; and a disable circuit comprising:

a timer circuit to receive a control signal and to generate a first signal comprising a filtered version of the control signal;

a pull-down control circuit coupled to receive the first signal from the timer circuit and, based on the first signal, to generate a first one or more signals to selectively enable or disable the pull-down transistor; and a shut-off control circuit coupled to receive the first signal from the timer circuit, and, based on the first signal, to generate a second one or more signals to selectively enable or disable the upper transistor.

2. The device of claim 1, further comprising a controller coupled to the disable circuit, the controller comprising circuitry to:

perform an evaluation which detects a transition to a first power state by a load circuit; and based on the evaluation, communicate an indication of the transition to the disable circuit via the control signal, wherein the disable circuit is to disable the upper transistor and the pull-down transistor based on the indication.

3. The device of claim 1, wherein the shut-off control circuit comprises:

a voltage divider comprising two resistors coupled in series with each other between the first interconnect and the second interconnect;

an inverter circuit coupled between the second interconnect and a first node between the two resistors, wherein the inverter circuit is further coupled to receive the first signal and to generate a second signal based on the first signal;

a first transistor coupled between the first node and a gate terminal of the upper transistor; and a second transistor coupled between the first node and another terminal of the upper transistor.

4. The device of claim 3, wherein respective gate terminals of the first transistor and the second transistor are each coupled to receive the second signal.

5. The device of claim 4, wherein the first transistor and the second transistor are PMOS transistors, wherein respective body terminals of the first transistor and the second transistor are each coupled to receive the first supply voltage.

6. The device of claim 3, wherein the pull-down control circuit comprises a third transistor which is coupled between a gate terminal of the pull-down transistor and the second interconnect, wherein a gate terminal of the third transistor is coupled to receive the first signal.

7. The device of claim 6, wherein the third transistor is an NMOS transistor, and wherein a body terminal of the third transistor and the second transistor are each coupled to receive the second supply voltage.

8. The device of claim 3, wherein the inverter circuit comprises a PMOS transistor and an NMOS transistor, wherein a body terminal of the PMOS transistor is coupled to receive the first supply voltage.

9. The device of claim 8, wherein a body terminal of the NMOS transistor is coupled to receive the second supply voltage.

10. A method comprising:

receiving a first supply voltage and a second supply voltage at a first interconnect and a second interconnect, respectively, wherein a power clamp circuit comprises an upper transistor coupled to the first interconnect, and a pull-down transistor coupled between the upper transistor and the second interconnect;

receiving at a disable circuit a control signal;

with a timer circuit of the disable circuit, generating a first signal comprising a filtered version of the control signal;

with a pull-down control circuit of the disable circuit, generating a first one or more signals, based on the first signal, to selectively enable or disable the pull-down transistor; and with a shut-off control circuit of the disable circuit, generating a second one or more signals, based on the first signal, to selectively enable or disable the upper transistor.

11. The method of claim 10, further comprising:

performing, at a controller circuit, an evaluation which detects a transition to a first power state by a load circuit; and based on the evaluation, communicating an indication of the transition to the disable circuit via the control signal, wherein the disable circuit disables the upper transistor and the pull-down transistor based on the indication.

12. The method of claim 10, wherein the shut-off control circuit comprises:

a voltage divider comprising two resistors coupled in series with each other between the first interconnect and the second interconnect;

an inverter circuit coupled between the second interconnect and a first node between the two resistors, wherein the inverter circuit receives the first signal and generates a second signal based on the first signal;

a first transistor coupled between the first node and a gate terminal of the upper transistor; and a second transistor coupled between the first node and another terminal of the upper transistor.

13. The method of claim 12, wherein respective gate terminals of the first transistor and the second transistor are each coupled to receive the second signal.

14. The method of claim 12, wherein the pull-down control circuit comprises a third transistor which is coupled between a gate terminal of the pull-down transistor and the second interconnect, wherein a gate terminal of the third transistor is coupled to receive the first signal.

15. A system comprising:

a voltage converter coupled to receive a first supply voltage and a second supply voltage via a first interconnect and a second interconnect, respectively, the voltage converter further to generate at an output node an output voltage based on the first supply voltage and the second supply voltage;

a load circuit coupled to receive the output voltage from the output node;

a power clamp circuit comprising:

an upper transistor coupled to the first interconnect; and a pull-down transistor coupled between the upper transistor and the second interconnect; and a disable circuit comprising:

a timer circuit to receive a control signal and to generate a first signal comprising a filtered version of the control signal;

a pull-down control circuit coupled to receive the first signal from the timer circuit and, based on the first signal, to generate a first one or more signals to selectively enable or disable the pull-down transistor; and a shut-off control circuit coupled to receive the first signal from the timer circuit, and, based on the first signal, to generate a second one or more signals to selectively enable or disable the upper transistor.

16. The system of claim 15, further comprising a controller coupled to the disable circuit, the controller comprising circuitry to:

perform an evaluation which detects a transition to a first power state by the load circuit; and based on the evaluation, communicate an indication of the transition to the disable circuit via the control signal, wherein the disable circuit is to disable the upper transistor and the pull-down transistor based on the indication.

17. The system of claim 15, wherein the shut-off control circuit comprises:

a voltage divider comprising two resistors coupled in series with each other between the first interconnect and the second interconnect;

an inverter circuit coupled between the second interconnect and a first node between the two resistors, wherein the inverter circuit is further coupled to receive the first signal and to generate a second signal based on the first signal;

a first transistor coupled between the first node and a gate terminal of the upper transistor; and a second transistor coupled between the first node and another terminal of the upper transistor.

18. The system of claim 17, wherein respective gate terminals of the first transistor and the second transistor are each coupled to receive the second signal.

19. The system of claim 17, wherein the pull-down control circuit comprises a third transistor which is coupled between a gate terminal of the pull-down transistor and the second interconnect, wherein a gate terminal of the third transistor is coupled to receive the first signal.

20. The system of claim 17, wherein the inverter circuit comprises a PMOS transistor and an NMOS transistor, wherein a body terminal of the PMOS transistor is coupled to receive the first supply voltage.

* * * * *